United States Patent
Noack

(10) Patent No.: US 10,650,892 B2
(45) Date of Patent: May 12, 2020

(54) TERNARY MEMORY CELL AND TERNARY MEMORY CELL ARRANGEMENT

(71) Applicant: Ferroelectric Memory GmbH, Dresden (DE)

(72) Inventor: Marko Noack, Dresden (DE)

(73) Assignee: FERROELECTRIC MEMORY GMBH, Dresden (DE)

(*) Notice: Subject to any disclaimer, the term of this patent is extended or adjusted under 35 U.S.C. 154(b) by 22 days.

(21) Appl. No.: 15/959,688

(22) Filed: Apr. 23, 2018

(65) Prior Publication Data

US 2019/0325963 A1 Oct. 24, 2019

(51) Int. Cl.
  *G11C 15/04* (2006.01)
(52) U.S. Cl.
  CPC ..................... *G11C 15/04* (2013.01)
(58) Field of Classification Search
  CPC ........................................... G11C 15/04
  USPC ........................................ 365/49.13
  See application file for complete search history.

(56) References Cited

U.S. PATENT DOCUMENTS

| | | | | |
|---|---|---|---|---|
| 5,218,566 | A * | 6/1993 | Papaliolios | G11C 11/22 365/145 |
| 7,499,303 | B2 * | 3/2009 | Lien | G11C 11/22 365/49.1 |
| 8,059,438 | B2 * | 11/2011 | Chang | G11C 7/1006 365/148 |
| 2004/0141348 | A1 * | 7/2004 | Shau | G11C 15/04 365/49.1 |
| 2006/0067097 | A1 | 3/2006 | Lien et al. | |
| 2007/0183191 | A1 | 8/2007 | Kim | |
| 2012/0218802 | A1 * | 8/2012 | Marukame | G11C 15/02 365/50 |
| 2014/0347906 | A1 * | 11/2014 | Menut | G11C 15/04 365/49.17 |

(Continued)

OTHER PUBLICATIONS

V. Fedorov, entitled "FTCAM: An Area-efficient Flash-based Ternary CAM Design" © 2015 IEEE (8 pages) (Year: 2015).*
P. Junsangstri et al., entitled A Memristor-based TCAM (Ternary Content Addressable Memory) Cell © 2014 IEEE (6 pages) (Year: 2014).*

(Continued)

*Primary Examiner* — Huan Hoang
*Assistant Examiner* — Muna A Techane
(74) *Attorney, Agent, or Firm* — Hickman Palermo Becker Bingham LLP; Malgorzata A. Kulczycka

(57) ABSTRACT

In various embodiments, a ternary memory cell is provided, the ternary memory cell including: a first ferroelectric memory cell and a second ferroelectric memory cell in a parallel or serial arrangement, wherein each of the first ferroelectric memory cell and the second ferroelectric memory cell is switchable into a first ferroelectric memory cell state and a second ferroelectric memory cell state; and wherein a first matching state is defined by the first ferroelectric memory cell in the first ferroelectric memory cell state and the second ferroelectric memory cell in the second ferroelectric memory cell state, wherein a second matching state is defined by the first ferroelectric memory cell in the second ferroelectric memory cell state and the second ferroelectric memory cell in the first ferroelectric memory cell state, and wherein a third matching state is defined by the first ferroelectric memory cell and the second ferroelectric memory cell being in the same ferroelectric memory cell state.

20 Claims, 12 Drawing Sheets

(56) References Cited

U.S. PATENT DOCUMENTS

| | | | |
|---|---|---|---|
| 2016/0012896 A1* | 1/2016 | Li | G11C 16/10 365/185.18 |
| 2019/0237470 A1* | 8/2019 | Mine | G11C 11/22 |

OTHER PUBLICATIONS

K. Pigiamtzis, entitled "Content-Addressable Memory (CAM) Circuits and Architectures: A Tutorial and Survey" IEEE Journal, vol. 41, No. 3 (Year: 2006).*

Yin et al., "Design and Benchmark of Ferroelectric FET Based TCAM", Design, Automation and Test in Europe Conference and Exhibition, dated Mar. 27, 2017, 6 pages (Year: 2017).*

Yin et al., "Design and Benchmark of Ferroelectric FET Based TCAM", Design, Automation and Test in Europe Conference and Exhibition, dated Mar. 27, 2017, 6 pages.

The International Searching Authority, "Search Report", in application No. PCT/EP2019/058911, dated Jul. 4, 2019, 17 pages.

Current Claims in application No. PCT/EP2019/058911, dated Jul. 2019, 10 pages.

Bayram Ismail et al., "NV-TCAM: Alternative Designs with NVM Devices", Intergration, The VLSI Journal, North-Holland Publishing Company. Amsterdam, NL, vol. 62, dated Feb. 16, 2018, 9 pages.

V. Fedorov, entitled "FTCAM: An Area-efficient Flash-based Ternary CAM Design" © 2015 IEEE (8 pages).

P. Junsangstri et al., entitled A Memristor-based TCAM (Ternary Content Addressable Memory) Cell © 2014 IEEE (6 pages).

K. Pigiamtzis, entitled "Content-Addressable Memory (CAM) Circuits and Architectures: A Tutorial and Survey" IEEE Journal, vol. 41, No. 3 dated Mar. 2006 (16 pages).

* cited by examiner

FIG. 1A
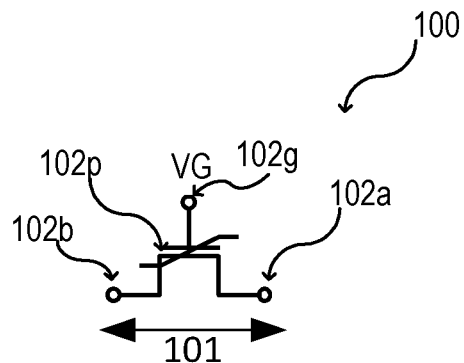
FIG. 1B
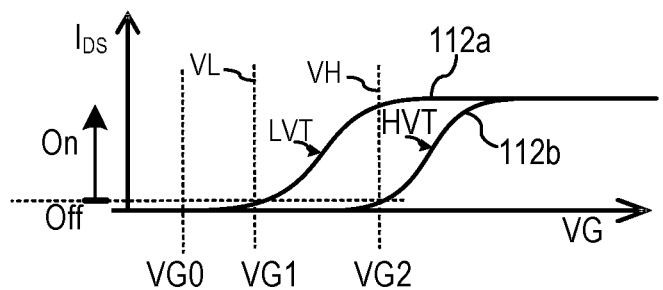
FIG. 1C
| 122 | HVT 112b | LVT 112a |
|---|---|---|
| VG0 | OFF | OFF |
| VG1 | OFF | ON |
| 132 | HVT 112b | LVT 112a |
|---|---|---|
| VG1 | OFF | ON |
| VG2 | ON | ON | read

TERNARY MEMORY CELL AND TERNARY MEMORY CELL ARRANGEMENT

TECHNICAL FIELD

Various embodiments relate to a ternary memory cell and a ternary memory cell arrangement.

BACKGROUND

In general, various computer memory technologies have been developed in semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is changed, e.g., in a controlled manner. Changing or setting a memory state may be referred to as programming the memory cell. The information stored in the memory cell may be obtained by determining in which of the memory states the memory cell is. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly.

In general, a content-addressable memory (CAM) may be designed in such a way that lookup data may be compared against stored data, and, in the case that stored data match with the lookup data, a corresponding address of these stored data is provided as a result. The lookup data may be referred to as lookup word or search word, e.g. a word based on a number of n-bits. The stored data may be referred to as stored word, e.g. a word based on a number of n-bits. The content-addressable memory may be also referred to as associative memory, associative storage, or associative array. The content-addressable memory may be used in searching applications, e.g. in computer networking devices as, for example, network routers, etc. In general, a content-addressable memory may be based on binary CAM cells or ternary CAM cells. In a content-addressable memory based on binary CAM cells, the words are stored using only two distinct logic states, e.g. either a logic "1" or a logic "0". In this case, the searched word has to be identical to the stored word to achieve a match. Ternary CAM cells have an additional logic state (X) that allows introducing a certain fuzziness in the stored words. This additional logic state is referred to as "do not care" state. During a search, this additional logic state may match to both a logic "1" and a logic "0". This may add flexibility to a search, since, for example, a stored two bit word (0, X) would match to both the search word (0, 0) and the search word (0, 1), as example.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1A shows a remanent-polarizable memory cell, according to various embodiments;

FIG. 1B illustrates an electrical behavior of a remanent-polarizable memory cell for two memory states, according to various embodiments;

FIG. 1C illustrates control schemes for a remanent-polarizable memory cell, according to various embodiments;

DESCRIPTION

Figure 2A:
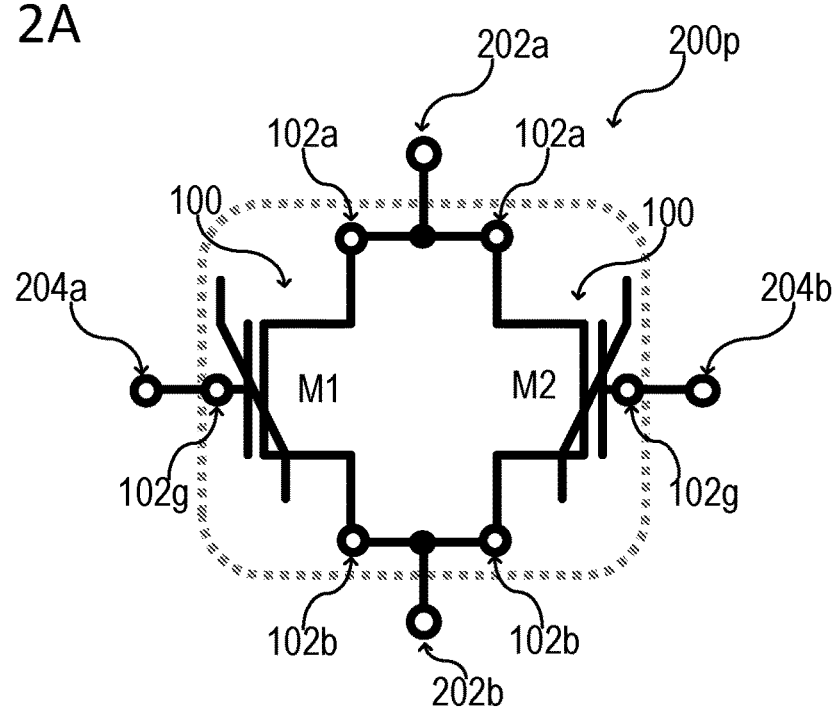
FIG. 2A shows a ternary memory cell having two remanent-polarizable memory cells in a parallel arrangement, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "electrically coupled" may be used herein to mean electrically connected, which may include a direct connection or an indirect connection, wherein an indirect connection may only include additional structures in the current path that not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

In semiconductor industry, the integration of non-volatile memory technologies may be useful for System-on-Chip (SoC) products like microcontrollers (MCU), etc. According to various embodiments, a nonvolatile memory, e.g. a ternary CAM, may be integrated next to a logic circuit, e.g. next to a processor core. In the case that nonvolatile memory technologies are integrated on the same semiconductor chip as a logic circuit (e.g., next to one or more processor cores), they may be referred to as embedded nonvolatile memories (eNVM). The eNVM market may be at present dominated by embedded Flash (eFlash).

Another memory technology may be based on a ferroelectric field-effect transistor (FeFET). In this case, a memory cell may include a field-effect transistor (FET) having a ferroelectric material as a gate insulator. Alternatively, a gate of a field-effect transistor (FET) may be coupled with a ferroelectric capacitor structure to provide a ferroelectric field-effect transistor (FeFET). Since a ferroelectric material has at least two stable polarization states, it may be used to shift the threshold voltage of the field-effect transistor in a nonvolatile fashion; and, therefore, to turn the field-effect transistor into a nonvolatile field-effect transistor that stores its state in a nonvolatile fashion, when power is removed.

In comparison to other emerging memory technologies, the FeFET memory cell may be integrated in the Front-End-of-Line (FEoL) and/or in the Back-End-of-Line (BEoL) process flow, since it is a transistor-type of memory. Accordingly, the integration of the FeFET memory cell may comply with the standard FEoL complementary metal-oxide-semiconductor (CMOS) process flow. Consequently, various different integration schemes may be used to integrate a FeFET in different process technologies, e.g., gate-first technologies, gate-last technologies, fully-depleted silicon-on-insulator (FDSOI) technologies, Fin-FET technologies, nanosheet technologies, nanowire technologies, etc. Those different process technologies may be, for example, relevant for technology nodes with a feature size equal to or less than 45 nm. According to various embodiments, two FeFET memory cells may be used to provide a ternary CAM cell. Since the ternary CAM cell is based on FeFET memory cells, i.e. on a transistor-type of memory, the ternary CAM cell may be integrated together with one or more logic transistors in a (CMOS) process flow. In this case, a feature size of both the FeFETs for the CAM cell and the logic transistors may be equal to or less than 45 nm.

The integration of FeFET memory cells on advanced CMOS process platforms may be carried out in a gate-first process technology. However, FeFET memory cells may be implemented into other process technologies, wherein different integration schemes may be used. The FeFET memory cells may be integrated, for example, next to one or more logic circuit structures, e.g., next to one or more processor cores on a chip. However, the FeFET memory cells may be integrated independently from other structures.

According to various embodiments, a ferroelectric material may be used as part of a memory structure. The ferroelectric material may be or may include ferroelectric $HfO_2$. Ferroelectric $HfO_2$ may include any form of hafnium oxide that may exhibit ferroelectric properties. This may include, for example, pure $HfO_2$, a solid solution of $HfO_2$ and $ZrO_2$ (e.g. but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide.

Various embodiments are related to a remanently-polarizable layer as memory layer or as a functional part of a memory structure. In general, a remanent polarization (also referred to as retentivity or remanence) may be present in a material layer in the case that the material layer may remain polarized upon reduction of an applied electric field (E) to zero, therefore, a certain value for the electrical polarization (P) of the material layer may be detected. Illustratively, a polarization remaining in a material, when the electric field is reduced to zero, may be referred to as remanent polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to described remanent magnetization in magnetic materials.

Further, the term spontaneously polarized or spontaneous polarization may be used with reference to a residual polarization. The coercivity of a material may be a measure of the strength of the reverse polarizing electric field that may be required to remove a remanent polarization. A remanent polarization may be evaluated via analyzing one or more hysteresis measurements (e.g., hysteresis curves), e.g., in a plot of P versus E, in which the material is polarized into opposite directions. A remanent polarization may be analyzed using capacity spectroscopy, e.g., via a static (C-V) and/or time-resolved measurement or by polarization-voltage (P-V) or positive-up-negative-down (PUND) measurements.

According to various embodiments, various designs for a ternary memory (e.g. a content addressable memory) cell and a ternary memory cell (e.g. a content addressable memory cell) arrangement are described in the following. In general, ternary content addressable memories (also referred to as TCAMs) may include memories, which provide a certain address as result, if the associated data is applied to the input. TCAMs also allow for placeholders (also referred to as "X" or do not care state), which match any data. Conventional TCAM cells may be built in CMOS technology and, in this case, a single TCAM cell may include a large number of (e.g. a number of 17) transistors coupled with one another. In contrast, according to various embodiments, a ternary memory cell may be provided based on only two remanent-polarizable memory cells, e.g. two ferroelectric field effect transistors (also referred to as FeFETs). A further advantage compared to CMOS technology may be that the storage of data is carried out in a non-volatile manner. This approach may save chip area and costs. Further, ferroelectric field effect transistors may be integrated efficiently side-by-side with logic circuits, even in the case the logic circuits are formed with a narrow feature size, e.g. with a feature size less than about 45 nm.

FIG. 1A illustrates a remanent-polarizable memory cell 100 in a schematic view, according to various embodiments. The remanent-polarizable memory cell 100 may include at least one remanent-polarizable layer 102p, e.g. including or consisting of a remanent-polarizable material. The remanent-polarizable material may be, for example, ferroelectric hafnium oxide. According to various embodiments, the remanent-polarizable memory cell 100 may include a first terminal 102a, a second terminal 102b, and a control terminal 102g. The remanent-polarizable memory cell 100 may be configured such that an electrical behavior of the first terminal 102a and the second terminal 102b may be controlled via the control terminal 102g. The electrical behavior of the first terminal 102a and the second terminal 102b may include, for example, an electrical resistance associated with an electrical current flow 101 between the first terminal 102a and the second terminal 102b. The electrical current flow 101 between the first terminal 102a and the second terminal 102b may be controlled by controlling a gate voltage VG that is applied at the control terminal 102g. In other words, the electrical current flow 101 between the first terminal 102a and the second terminal 102b may be varied by varying a gate voltage VG that is applied at the control terminal 102g.

The remanent-polarizable memory cell 100 may be a ferroelectric field-effect transistor (FeFET), wherein the first terminal 102a may be a first source/drain terminal, the second terminal 102b may be a second source/drain terminal, and the control terminal 102g may be a gate terminal. In this case, the electrical current flow 101 between the first source/drain terminal and the second source/drain terminal may be controlled by controlling a gate voltage VG that is applied at the gate terminal.

FIG. 1B illustrates a schematic current/voltage (I/V) diagram representing an electrical behavior of a remanent-polarizable memory cell 100, according to various embodiments. The remanent-polarizable memory cell 100 may be or may include a ferroelectric field effect transistor. As an example, the remanent-polarizable memory cell 100 may include a first memory state 112a, e.g. a low threshold voltage state (LVT), and a second memory state 112b, e.g. a high threshold voltage state (HVT). The remanent-polarizable memory cell 100 may be switched between the first memory state 112a and the second memory state 112b by changing the remanent-polarization of the at least one remanent-polarizable layer 102p included in the remanent-polarizable memory cell 100. For each memory state 112a, 112b, the electrical current flow (see vertical axis $I_{DS}$) between the first terminal 102a and the second terminal 102b may be controlled by controlling a control voltage (see horizontal axis VG) that is applied at the control terminal 102g. For a FeFET, the control voltage may be referred to as gate voltage, for example. The remanent-polarizable memory cell 100 may have a first threshold voltage VL in the memory state 112a and a second threshold voltage VH in the second memory state 112b. The first threshold voltage VL may be less than the second threshold voltage VH.

FIG. 1C illustrates exemplary control schemes 122, 132 to control the remanent-polarizable memory cell 100 in each of its memory states 112a, 112b, according to various embodiments. As an example, in the first memory state 112a, the remanent-polarizable memory cell 100 may be configured to be electrically conductive (also referred to as "on", i.e. allowing a substantial current flow 101 between the first terminal 102a and the second terminal 102b) in the case that a second (e.g. pre-defined) gate voltage VG1 is applied to the control terminal 102g as well as in the case that a third (e.g. pre-defined) gate voltage VG2 is applied to the control terminal 102g. Further, in the first memory state 112a, the remanent-polarizable memory cell 100 may be configured to be electrically isolating (also referred to as non-conductive or "off", i.e. preventing a substantial current flow 101 between the first terminal 102a and the second terminal 102b) in the case that a first (e.g. pre-defined) gate voltage VG0 is applied to the control terminal 102g. As illustrated in FIG. 1B, the third gate voltage VG2 may be greater than the second gate voltage VG1, and the second gate voltage VG1 may be greater than the first gate voltage VG0.

Further, in the second memory state 112b, the remanent-polarizable memory cell 100 may be configured to be electrically conductive (also referred to as "on", i.e. allowing a substantial current flow 101 between the first terminal 102a and the second terminal 102b) in the case that the third gate voltage VG2 is applied to the control terminal 102g. Further, in the second memory state 112b, the remanent-polarizable memory cell 100 may be configured to be electrically isolating (also referred to as non-conductive or "off", i.e. preventing a substantial current flow 101 between the first terminal 102a and the second terminal 102b) in the case that the first gate voltage VG0 is applied to the control terminal 102g as well as in the case that the second gate voltage VG1 is applied to the control terminal 102g.

According to various embodiments, the first control scheme 122 may be applied in the case that two remanent-polarizable memory cells 100 are coupled in parallel with one another to provide a ternary memory cell. The second control scheme 132 may be applied in the case that two remanent-polarizable memory cells 100 are coupled in series with one another to provide a ternary memory cell.

Illustratively, the remanent-polarizable memory cell 100 may be switched "on" and "off" at pre-defined control voltages depending on the respective memory state 112a, 112b (LVT, HVT) of the remanent-polarizable memory cell 100. According to various embodiments, a FeFET may be used as remanent-polarizable memory cell 100, wherein a current flow between the source/drain terminals may be substantially zero in the case that the FeFET is "off", e.g. in the case that a control voltage equal to or less than the first threshold voltage VL is applied at the gate terminal of the FeFET in the first memory state 112a and in the case that a control voltage equal to or less than the second threshold voltage VH is applied at the gate terminal of the FeFET in the second memory state 112b. Illustratively, a pre-defined gate voltage VG0, VG1, VG2 is associated with a threshold voltage VL, VH of the remanent-polarizable memory cell 100 (e.g. of a FeFET) in the respective memory state 112a, 112b.

As an example, two remanent-polarizable memory cells 100 (e.g. two FeFETs) may be used in parallel (e.g. in a NOR configuration) to provide the ternary memory cell, as described in the following. The parallel connection of the two remanent-polarizable memory cells 100 may allow discharging a first match line to a second match line (the second match line may be also referred to as discharge line) if one of the two remanent-polarizable memory cells 100 is conducting (in other words if one of the two remanent-polarizable memory cells 100 is "on"). The discharge of the first match line may be associated with a mismatch. A match may be detected only if none of the remanent-polarizable memory cells 100 is conducting and the first match line remains charged.

FIG. 2A shows a ternary memory cell 200p in a schematic view, according to various embodiments. Illustratively the ternary memory cell 200p may include or consist of two remanent-polarizable memory cells 100 coupled in parallel with one another.

According to various embodiments, the ternary memory cell 200p may include a first remanent-polarizable memory cell M1 and a second remanent-polarizable memory cell M2. Both remanent-polarizable memory cells M1, M2 may be configured as described herein with reference to the remanent-polarizable memory cell 100. In other words, the remanent-polarizable memory cell M1 may include a first terminal 102a, a second terminal 102b, and a control terminal 102g to control an electrical behavior of the first terminal 102a and the second terminal 102b of the first remanent-polarizable memory cell M1. Further, the second remanent-polarizable memory cell M2 may include a first terminal 102a, a second terminal 102b, and a control terminal 102g to control an electrical behavior of the first terminal 102a and the second terminal 102b of the second remanent-polarizable memory cell M2.

According to various embodiments, the ternary memory cell 200p may include a first match line node 202a to connect the ternary memory cell 200p to a first match line. Further, the ternary memory cell 200p may include a second match line node 202b to connect the ternary memory cell 200p to a second match line (or, in other words, the ternary memory cell 200p may include match line node and a discharge node to connect the ternary memory cell 200p to a match line and discharge line respectively). In a ternary memory cell arrangement, the respective match line nodes 202a, 202b of a plurality of ternary memory cells 200p may be connected with one another via a corresponding match line pair; these connected plurality of ternary memory cells 200p may form a first subset of ternary memory cells 200p within the memory cell arrangement. The memory cell arrangement may include a plurality of these first subsets. Each of the first subsets may be used to store a word within the memory cell arrangement. The length of the words may correspond to the number of ternary memory cells 200p in the respective first subset.

The ternary memory cell 200p may include a first lookup node 204a and a second lookup node 204b to connect the ternary memory cell to a first lookup line and a second lookup line respectively. In a ternary memory cell arrangement, the respective first lookup nodes 204a of a plurality of ternary memory cells 200p may be connected with one another via a corresponding first match line and the respective second lookup nodes 204b of the plurality of ternary memory cells 200p may be connected with one another via a corresponding second match line; these connected plurality of ternary memory cells 200p may form a second subset of ternary memory cells 200p within the memory cell arrangement. The memory cell arrangement may include a plurality of these second subsets. Each ternary memory cell 200p of the memory cell arrangement may be part of one specific first subset and one specific second subset. Illustratively, the ternary memory cells 200p of a memory cell arrangement may be arranged in any array that allows the desired addressing of the ternary memory cells 200p.

According to various embodiments, the first terminal 102a of the first remanent-polarizable memory cell M1 and the first terminal 102a of the second remanent-polarizable memory cell M2 may be electrically connected to the first match line node 202a. Illustratively, the respective first terminals 102a of the remanent-polarizable memory cells M1, M2 of the ternary memory cell 200p may be tied to one or more nodes that are on the same first electric potential.

According to various embodiments, the second terminal 102b of the first remanent-polarizable memory cell M1 and the second terminal 102b of the second remanent-polarizable memory cell M2 may be electrically connected to the second match line node 202b. Illustratively, the respective second terminals 102b of the remanent-polarizable memory cells M1, M2 of the ternary memory cell 200p may be tied to one or more nodes that are on the same second electric potential.

According to various embodiments, the control terminal 102g of the first remanent-polarizable memory cell M1 may be electrically connected to the first lookup node 204a and the control terminal 102g of the second remanent-polarizable memory cell M2 may be electrically connected to the second lookup node 204b. Illustratively, the ternary memory cell 200p may be addressed via the respective nodes 202a, 202b, 204a, 204b. In a memory cell arrangement, a plurality of ternary memory cells 200p may be individually addressable via their respective nodes 202a, 202b, 204a, 204b, as for example illustrated in FIG. 5.

As another example, two remanent-polarizable memory cells 100 (e.g. two FeFETs) may be used in series (e.g. in a NAND configuration) to provide the ternary memory cell, as described in the following. The series connection of the two remanent-polarizable memory cells 100 may allow discharging a first match line to a second match line only if both of the two remanent-polarizable memory cells 100 are conducting. The discharge of the first match line may be associated with a mismatch. A match may be detected only if none or only one of the remanent-polarizable memory cells 100 is conducting, or in other words, if the first match line remains pre-charged.

However, the NOR configuration, e.g. as described above, allows to use low lookup voltages to, for example, avoid a read disturb. Illustratively, lookup voltages less than the second threshold voltage VH may be used in the NOR configuration, as illustrated, for example, in FIG. 1B and FIG. 1C.

Figure 2B:
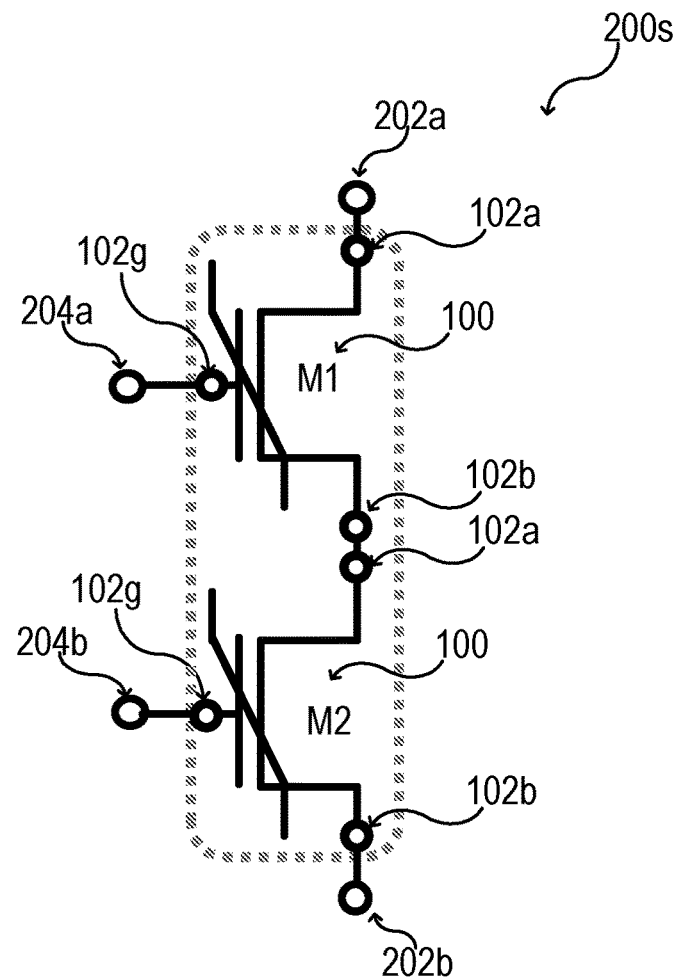
FIG. 2B shows a ternary memory cell having two remanent-polarizable memory cells in a serial arrangement, according to various embodiments.

FIG. 2B shows a ternary memory cell 200s in a schematic view, according to various embodiments. Illustratively the ternary memory cell 200s may include or consist of two remanent-polarizable memory cells 100 coupled in series with one another.

According to various embodiments, the ternary memory cell 200s may include a first remanent-polarizable memory cell M1 and a second remanent-polarizable memory cell M2. Both remanent-polarizable memory cells M1, M2 may be configured as described herein with reference to the remanent-polarizable memory cell 100. In other words, the first remanent-polarizable memory cell M1 may include a first terminal 102a, a second terminal 102b, and a control terminal 102g to control an electrical behavior of the first terminal 102a and the second terminal 102b of the first remanent-polarizable memory cell M1. Further, the second remanent-polarizable memory cell M2 may include a first terminal 102a, a second terminal 102b, and a control terminal 102g to control an electrical behavior of the first terminal 102a and the second terminal 102b of the second remanent-polarizable memory cell M2.

According to various embodiments, the ternary memory cell 200s may include a first match line node 202a to connect the ternary memory cell 200s to a first match line. Further, the ternary memory cell 200s may include a second match line node 202b to connect the ternary memory cell 200s to a second match line (or, in other words, the ternary memory cell 200s may include match line node and a discharge node to connect the ternary memory cell 200s to a match line and discharge line respectively). In a ternary memory cell arrangement, the respective match line nodes 202a, 202b of a plurality of ternary memory cells 200s may be connected with one another via a corresponding match line pair; this connected plurality of ternary memory cells 200s may form a first subset of ternary memory cells 200s within the memory cell arrangement. The memory cell arrangement may include a plurality of these first subsets. Each of the first subsets may be used to store a word within the memory cell arrangement. The length of the words may correspond to the number of ternary memory cells 200s in the respective first subset.

The ternary memory cell 200s may include a first lookup node 204a and a second lookup node 204b to connect the ternary memory cell to a first lookup line and a second lookup line respectively. In a ternary memory cell arrangement, the respective first lookup nodes 204a of a plurality of ternary memory cells 200s may be connected with one another via a corresponding first match line and the respective second lookup nodes 204b of the plurality of ternary memory cells 200s may be connected with one another via a corresponding second match line; these connected plurality of ternary memory cells 200s may form a second subset of ternary memory cells 200s within the memory cell arrangement. The memory cell arrangement may include a plurality of these second subsets. Each ternary memory cell 200s of the memory cell arrangement may be part of one specific first subset and one specific second subset.

According to various embodiments, the first terminal 102a of the first remanent-polarizable memory cell M1 may be electrically connected to the first match line node 202a. According to various embodiments, the second terminal 102b of the second remanent-polarizable memory cell M2 may be electrically connected to the second match line node 202b. Further, the second terminal 102b of the first remanent-polarizable memory cell M1 and the first 102a of the second remanent-polarizable memory cell M2 may be electrically connected to one another. Illustratively, the second terminal 102b of the first remanent-polarizable memory cell M1 and the first terminal 102a of the second remanent-polarizable memory cell M2 may be tied to the same electric potential.

According to various embodiments, the control terminal 102g of the first remanent-polarizable memory cell M1 may be electrically connected to the first lookup node 204a and the control terminal 102g of the second remanent-polarizable memory cell M2 may be electrically connected to the second lookup node 204b. Illustratively, the ternary memory cell 200s may be addressed via the respective nodes 202a, 202b, 204a, 204b. In a memory cell arrangement, a plurality of ternary memory cells 200s may be individually addressable via their respective nodes 202a, 202b, 204a, 204b, as for example illustrated in FIG. 5.

Figure 3A:
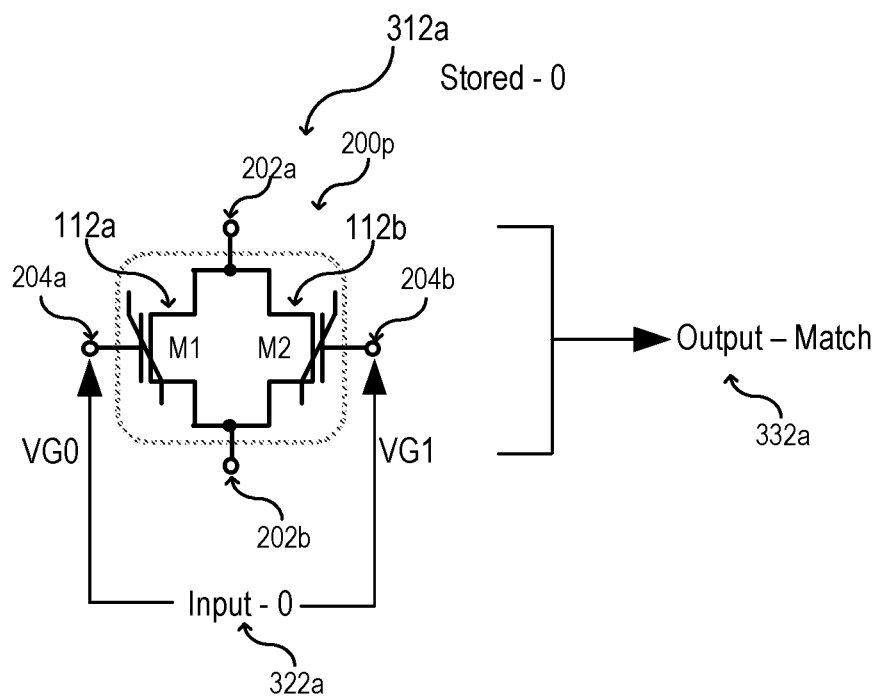
FIGS. 3A to 3F illustrate various input/output schemes for a ternary memory cell having two remanent-polarizable memory cells in a parallel arrangement, according to various embodiments.
Figure 3B:
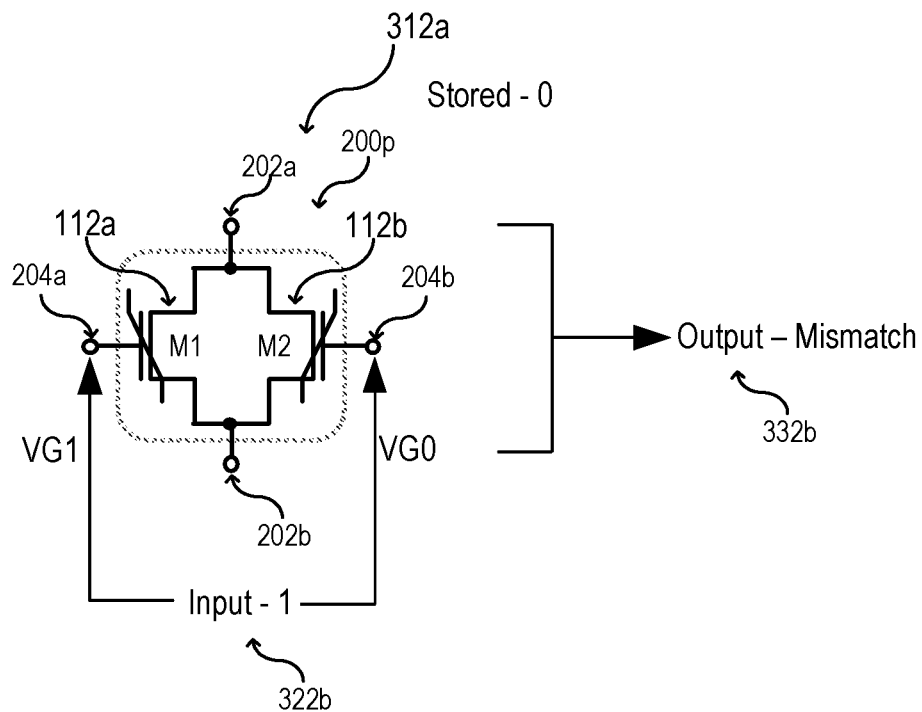
Figure 3C:
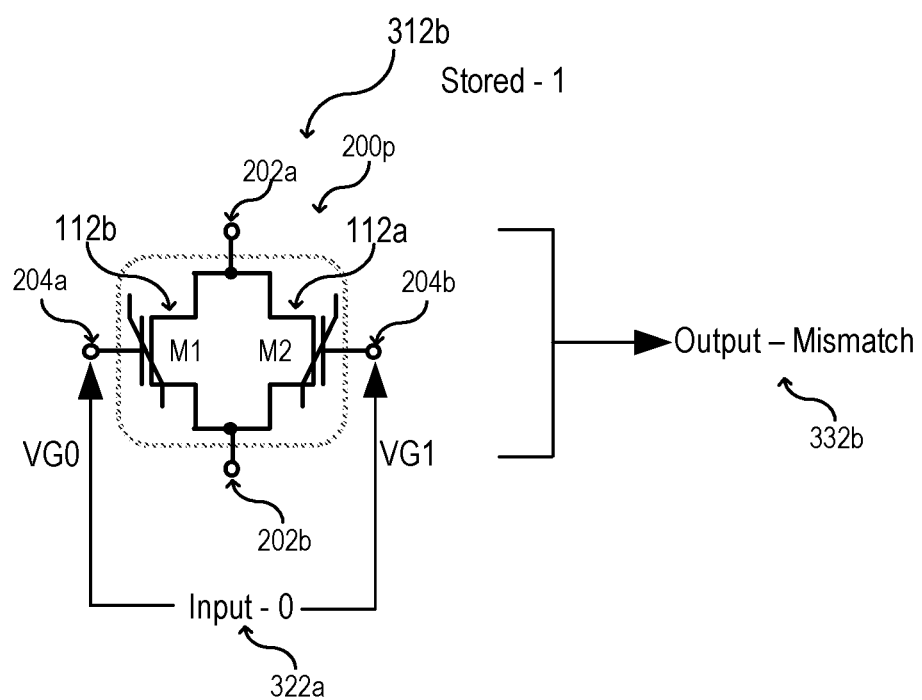
Figure 3D:
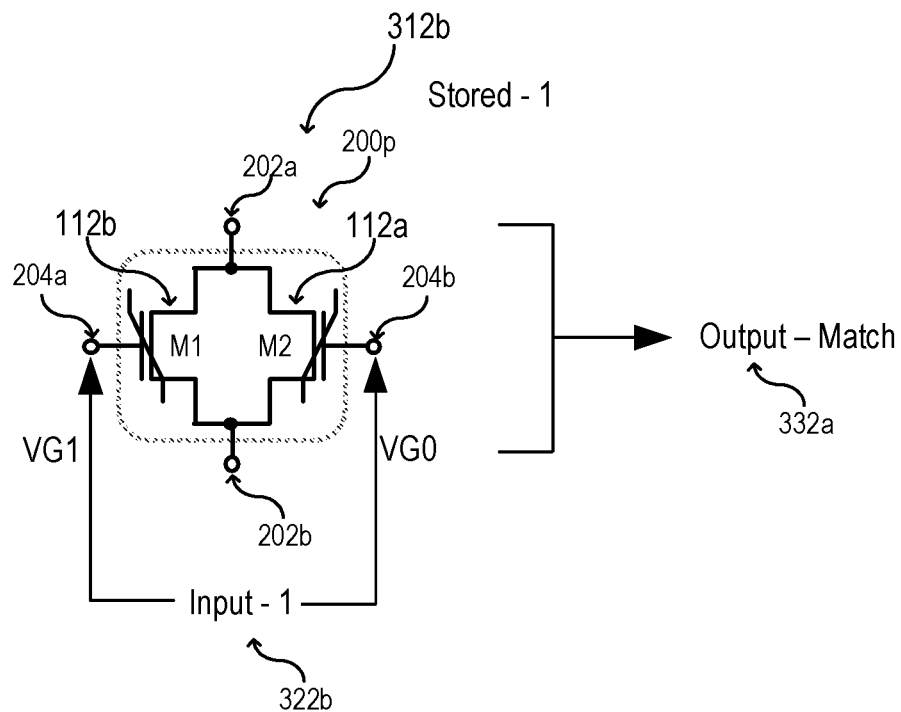
Figure 3E:
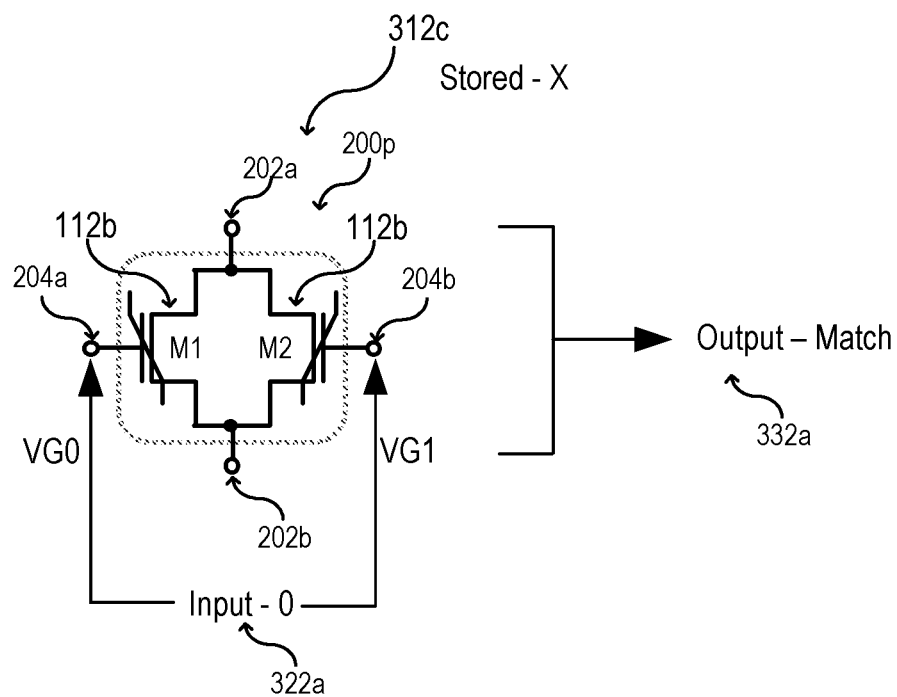
Figure 3F:
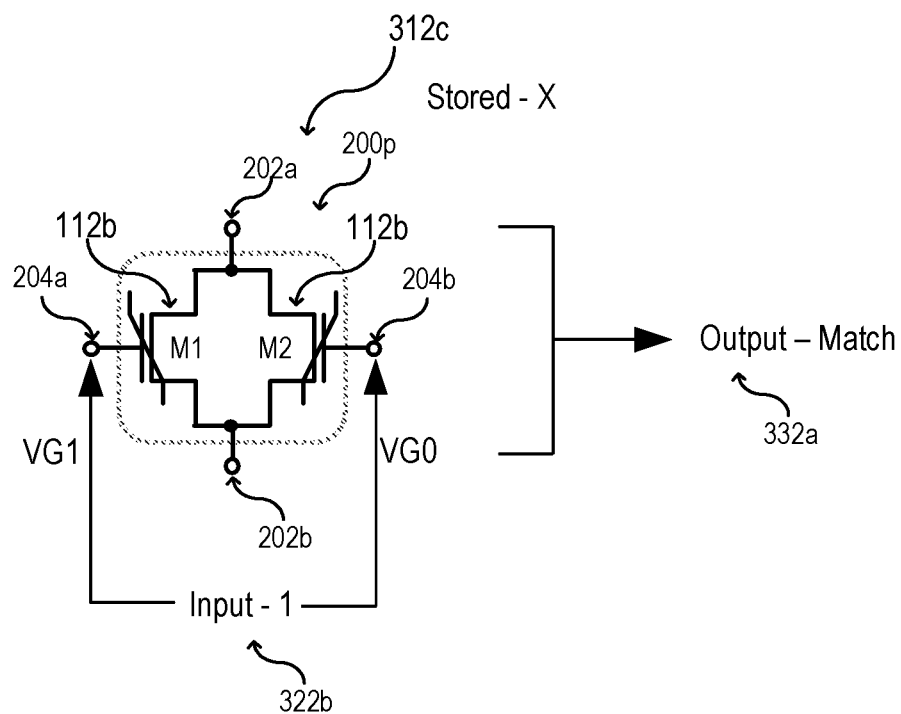

FIGS. 3A to 3F illustrate various input/output schemes for the ternary memory cell 200p, according to various embodiments. The ternary memory cell 200p may be in one of three (e.g. pre-defined) matching states 312a, 312b, 312c. In other words, the ternary memory cell 200p may be in or may be switched into a first matching state 312a (also referred to as a first ternary memory cell state), as illustrated in FIG. 3A and FIG. 3B. The first matching state 312a may represent, for example, a stored logic "0". In this state, the ternary memory cell 200p may match to an input of a logic "0", as illustrated in FIG. 3A, and may not match for an input of a logic "1", as illustrated in FIG. 3B. Further, the ternary memory cell 200p may be in or may be switched into a second matching state 312b (also referred to as a second ternary memory cell state), as illustrated in FIG. 3C and FIG. 3D. The second matching state 312b may represent, for example, a stored logic "1". In this state, the ternary memory cell 200p may not match to an input of a logic "0", as illustrated in FIG. 3C, and may match for an input of a logic "1", as illustrated in FIG. 3D. Further, the ternary memory cell 200p may be in or may be switched into a third matching state 312c (also referred to as a third ternary memory cell state), as illustrated in FIG. 3E and FIG. 3F. The third matching state 312c may represent, for example, a logic do not care state "X". In this state, the ternary memory cell 200p may match to an input of a logic "0", as illustrated in FIG. 3E, as well as for an input of a logic "1", as illustrated in FIG. 3F.

The input of a logic "0" or "1" may be achieved by applying a suitable lookup signal 322a, 322b. The lookup signal may include a first lookup voltage (e.g. a voltage that equals the first pre-defined gate voltage VG0) supplied to the first lookup node 204a and a second lookup voltage (e.g. a voltage that equals the second pre-defined gate voltage VG1) supplied to the second lookup node 204b, thereby representing a first lookup-value (in this case the logic "0"). Further, the lookup signal may include a first lookup voltage (e.g. a voltage that equals the first pre-defined gate voltage VG0) supplied to the second lookup node 204b and a second lookup voltage (e.g. a voltage that equals the second pre-defined gate voltage VG1) supplied to the first lookup node 204a, thereby representing a second lookup-value (in this case the logic "1").

Depending on the actual matching state 312a, 312b, 312c of the ternary memory cell 200p, a signal 332a, 332b may be output representing a match or mismatch. As an example, a stored logic "0" matches only if a logic "0" is input, illustratively, in this case the ternary memory cell 200p matches if a logic "0" is searched (or in other words if a logic "0" is looked up) and a match signal 332a is output. Further, a stored logic "1" matches only if a logic "1" is input, illustratively, in this case the ternary memory cell 200p matches if a logic "1" is searched (or in other words if a logic "0" is looked up) and a match signal 332a is output. Further, a stored logic "X" matches in both case if a logic "0" and "1" is input, illustratively, in this case the ternary memory cell 200p matches if a logic "0" or a logic "1" is searched and a match signal 332a is output. In all other cases, a mismatch signal 332b is output.

The match/mismatch signal 332a, 332b may be output from a number of n ternary memory cells 200p at the same time via a corresponding pair of match lines (also referred to as a first subset). In this case, a match for the n ternary memory cells 200p may be only detected in the case that all of the n ternary memory cells 200p match with their corresponding input. In this case, the first subset represents a stored word with the length n and a lookup word with the same length may be looked up. The lookup signal 322a, 322b may be applied to a number of m ternary memory cells 200p at the same time via a corresponding pair of lookup lines. In this case, each of the m ternary memory cells 200p is of a distinct first subset of a plurality of first subsets.

As illustrated in the FIGS. 3A to 3F, the ternary memory cell 200p may include or consist of two remanent-polarizable memory cells 100 coupled in parallel with one another. The three matching states 312a, 312b, 312c of the ternary memory cell 200p may be provided by a distinct combination of the memory states 112a, 112b of the remanent-polarizable memory cells M1, M2. As an example, the first matching state 312a may include the first remanent-polarizable memory cell M1 in its first memory state 112a and the second remanent-polarizable memory cell M2 in its second memory state 112b, as illustrated in FIG. 3A and FIG. 3B. As another example, the second matching state 312b may include the first remanent-polarizable memory cell M1 in its second memory state 112b and the second remanent-polarizable memory cell M2 in its first memory state 112a, as illustrated in FIG. 3C and FIG. 3D. As another example, the third matching state 312c may include the first remanent-polarizable memory cell M1 in its second memory state 112b and the second remanent-polarizable memory cell M2 in its second memory state 112b, as illustrated in FIG. 3E and FIG. 3F.

Figure 4A:
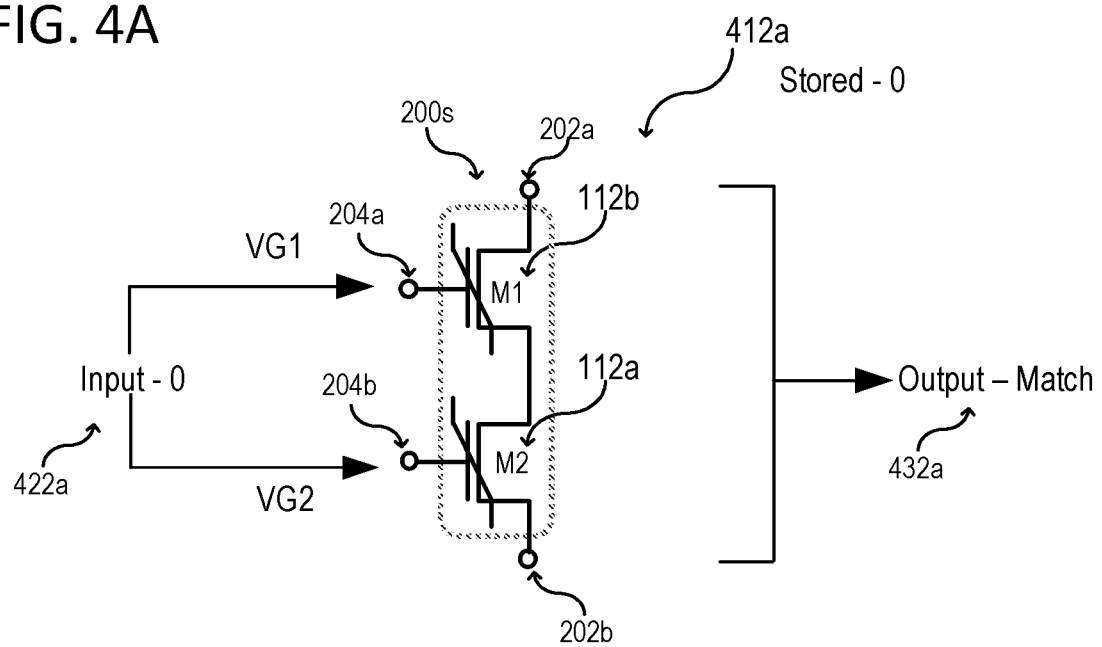
FIGS. 4A to 4F illustrate various input/output schemes for a ternary memory cell having two remanent-polarizable memory cells in a serial arrangement, according to various embodiments.
Figure 4B:
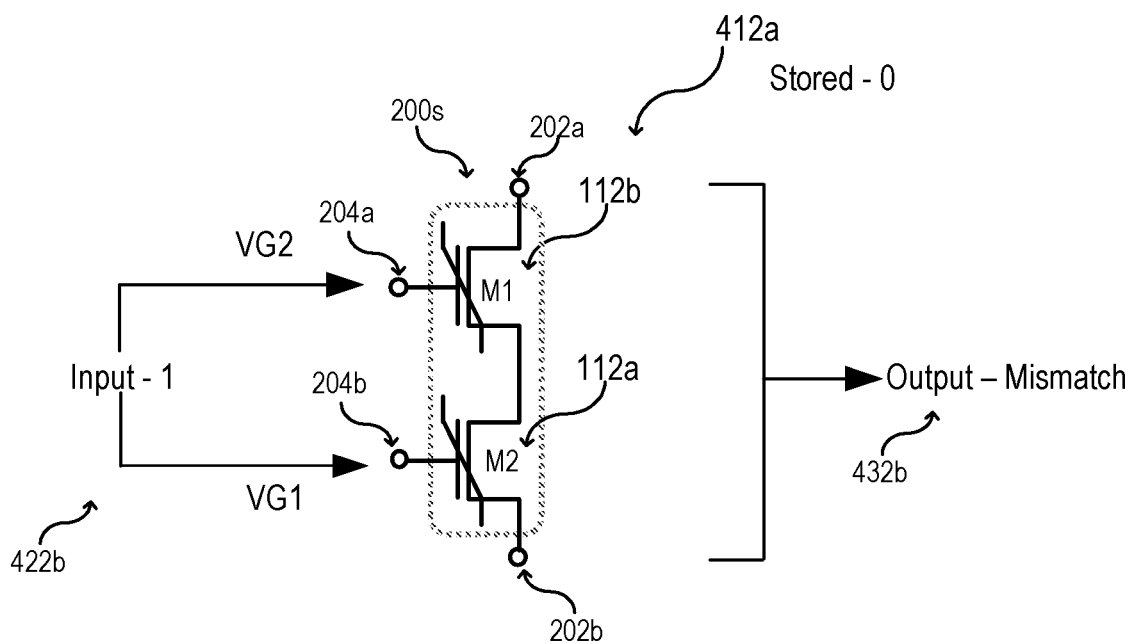
Figure 4C:
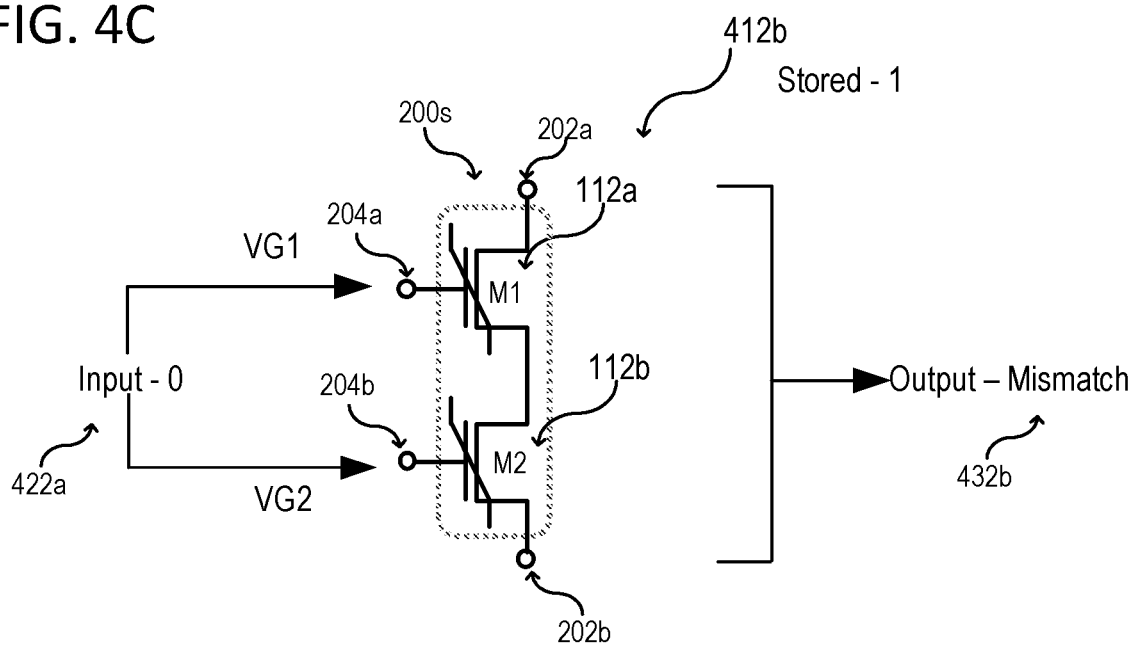
Figure 4D:
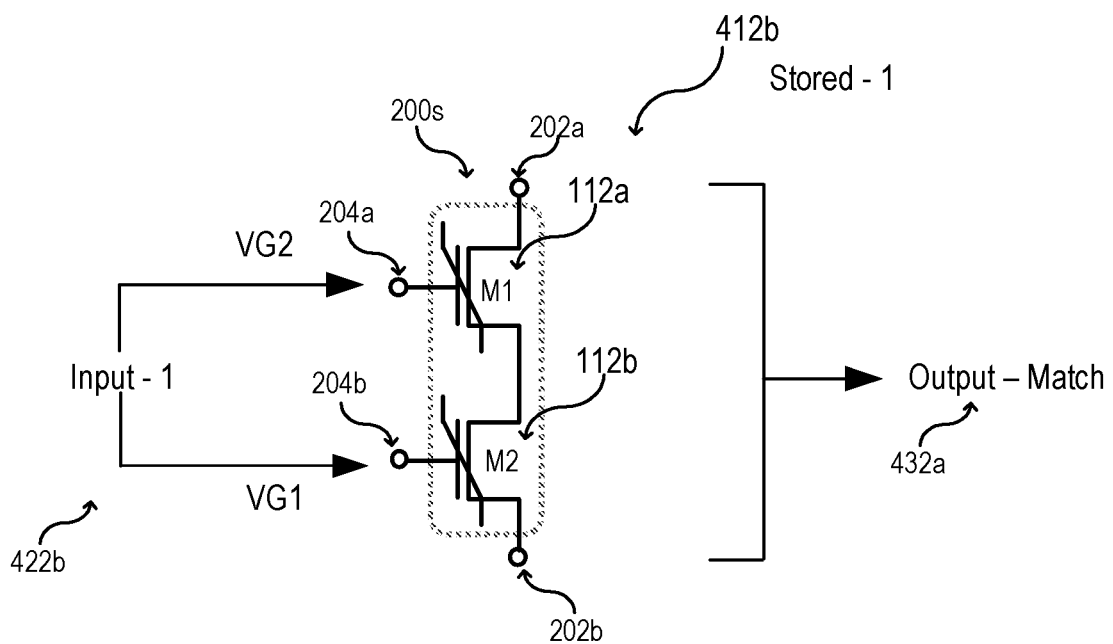
Figure 4E:
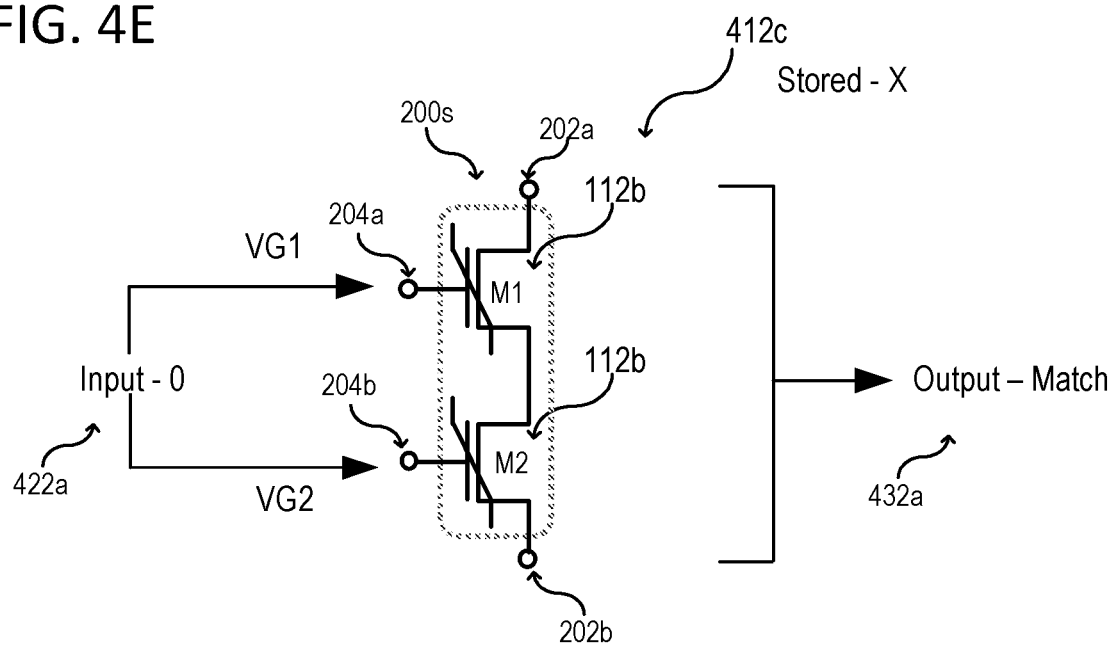
Figure 4F:
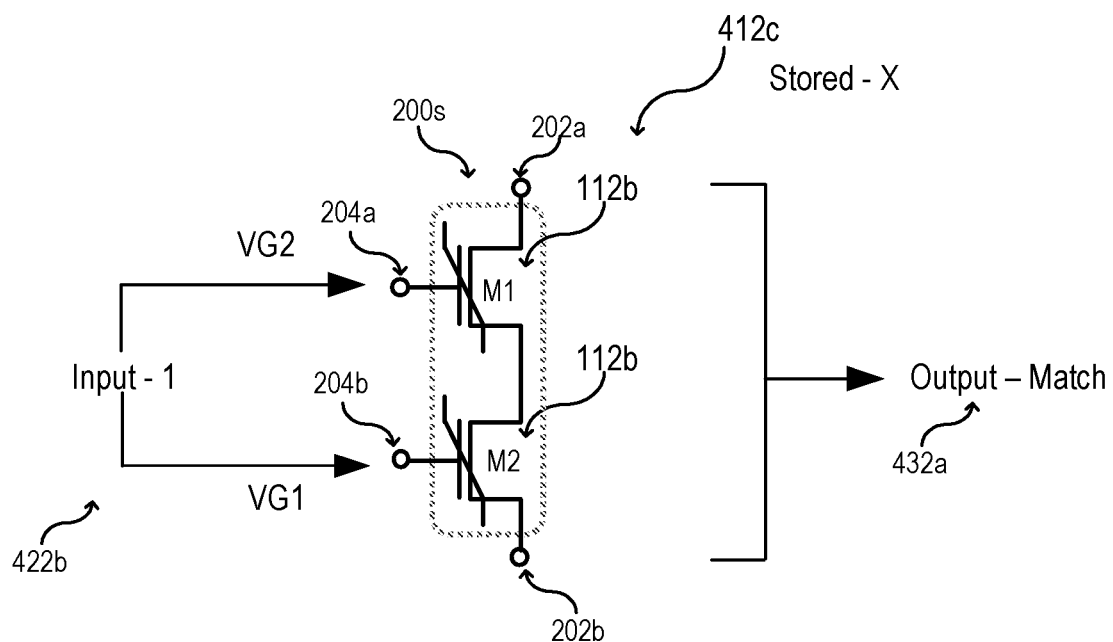

FIGS. 4A to 4F illustrate various input-output schemes for the ternary memory cell 200s, according to various embodiments. The ternary memory cell 200s may be in one of three (e.g. pre-defined) matching states 412a, 412b, 412c. In other words, the ternary memory cell 200s may be in or may be switched into a first matching state 412a (also referred to as a first ternary memory cell state), as illustrated in FIG. 4A and FIG. 4B. The first matching state 412a may represent, for example, a stored logic "0". In this state, the ternary memory cell 200s may match to an input of a logic "0", as illustrated in FIG. 4A, and may not match for an input of a logic "1", as illustrated in FIG. 4B. Further, the ternary memory cell 200s may be in or may be switched into a second matching state 412b (also referred to as a second ternary memory cell state), as illustrated in FIG. 4C and FIG. 4D. The second matching state 412b may represent, for example, a stored logic "1". In this state, the ternary memory cell 200s may not match to an input of a logic "0", as illustrated in FIG. 4C, and may match for an input of a logic "1", as illustrated in FIG. 4D. Further, the ternary memory cell 200s may be in or may be switched into a third matching state 412c (also referred to as a third ternary memory cell state), as illustrated in FIG. 4E and FIG. 4F. The third matching state 412c may represent, for example, a logic do not care state "X". In this state, the ternary memory cell 200s may match to an input of a logic "0", as illustrated in FIG. 4E, as well as for an input of a logic "1", as illustrated in FIG. 4F.

The input of a logic "0" or "1" may be achieved by applying a suitable lookup signal 422a, 422b. The lookup signal may include a first lookup voltage (e.g. a voltage that equals the second pre-defined gate voltage VG1) supplied to the first lookup node 204a and a second lookup voltage (e.g. a voltage that equals the third pre-defined gate voltage VG2) supplied to the second lookup node 204b, thereby representing a first lookup-value (in this case the logic "0"). Further, the lookup signal may include a first lookup voltage (e.g. a voltage that equals the second pre-defined gate voltage VG1) supplied to the second lookup node 204b and a second lookup voltage (e.g. the third pre-defined gate voltage VG2) supplied to the first lookup node 204a, thereby representing a second lookup-value (in this case the logic "1").

Depending on the actual matching state 412a, 412b, 412c of the ternary memory cell 200s, a signal 432a, 432b may be output representing a match or mismatch. As an example, a stored logic "0" matches only if a logic "0" is input, illustratively, in this case the ternary memory cell 200s matches if a logic "0" is searched (or in other words if a logic "0" is looked up) and a match signal 432a is output. Further, a stored logic "1" matches only if a logic "1" is input, illustratively, in this case the ternary memory cell 200s matches if a logic "1" is searched (or in other words if a logic "0" is looked up) and a match signal 432a is output. Further, a stored logic "X" matches in both case if a logic "0" and "1" is input, illustratively, in this case the ternary memory cell 200s matches if a logic "0" or a logic "1" is searched and a match signal 432a is output. In all other cases, a mismatch signal 432b is output.

The match/mismatch signal 432a, 432b may be output from a number of n ternary memory cells 200s at the same time via a corresponding pair of match lines (also referred to as a first subset). In this case, a match for the n ternary memory cells 200s may only detected in the case that all of the n ternary memory cells 200s match with their corresponding input. In this case, the first subset represents a stored word with the length n and a lookup word with the same length n may be looked up. The lookup signal 422a, 422b may be applied to a number of m ternary memory cells 200s at the same time via a corresponding pair of lookup lines. In this case, each of the m ternary memory cells 200s is of a distinct first subset of a plurality of first subsets.

As illustrated in the FIGS. 4A to 4F, the ternary memory cell 200s may include or consist of two remanent-polarizable memory cells 100 coupled in series with one another. The three matching states 412a, 412b, 412c of the ternary memory cell 200s may be provided by a distinct combination of the memory states 112a, 112b of the remanent-polarizable memory cells M1, M2. As an example, the first matching state 412a may include the first remanent-polarizable memory cell M1 in its second memory state 112b and the second remanent-polarizable memory cell M2 in its first memory state 112a, as illustrated in FIG. 4A and FIG. 4B. As another example, the second matching state 412b may include the first remanent-polarizable memory cell M1 in its first memory state 112a and the second remanent-polarizable memory cell M2 in its second memory state 112b, as illustrated in FIG. 4C and FIG. 4D. As another example, the third matching state 412c may include the first remanent-polarizable memory cell M1 in its second memory state 112b and the second remanent-polarizable memory cell M2 in its second memory state 112b, as illustrated in FIG. 4E and FIG. 4F.

According to various embodiments, a match signal 332a, 432a or a mismatch signal 332b, 432b may be output (in other words generated, obtained, etc.) dependent on the respective state 312a, 312b, 312c, 412a, 412b, 412c of one or more ternary memory cells 200p, 200s and the corresponding one or more input signals 322a, 322b, 422a, 422b. Illustratively, a match and/or mismatch may be detected or, in other words, a read operation may be carried out. As an example, a match line pair may be used, wherein a first match line is connected to the first match line node 202a of one or more ternary memory cells 200p, 200s and a second match line is connected to the second match line node 202b of one or more ternary memory cells 200p, 200s. The first match line may be pre-charged to a pre-defined voltage and the second match line node 202b may be coupled to an electrical potential (e.g. to ground) that allows a discharge of the first match line. In the case of a match, the respective ternary memory cell 200p, 200s may not electrically connect the first match line node 202a and the second match line node 202b with one another and, therefore, the first match line may remain pre-charged. This allows, for example, a detection of a match. In the other case, e.g. in the case of a mismatch, the respective ternary memory cell 200p, 200s may electrically connect the first match line node 202a and the second match line node 202b with one another and, therefore, the first match line may be discharged. This allows, for example, a detection of a mismatch. However, there may be other possibilities distinguishing a match and a mismatch from one another.

Figure 5:
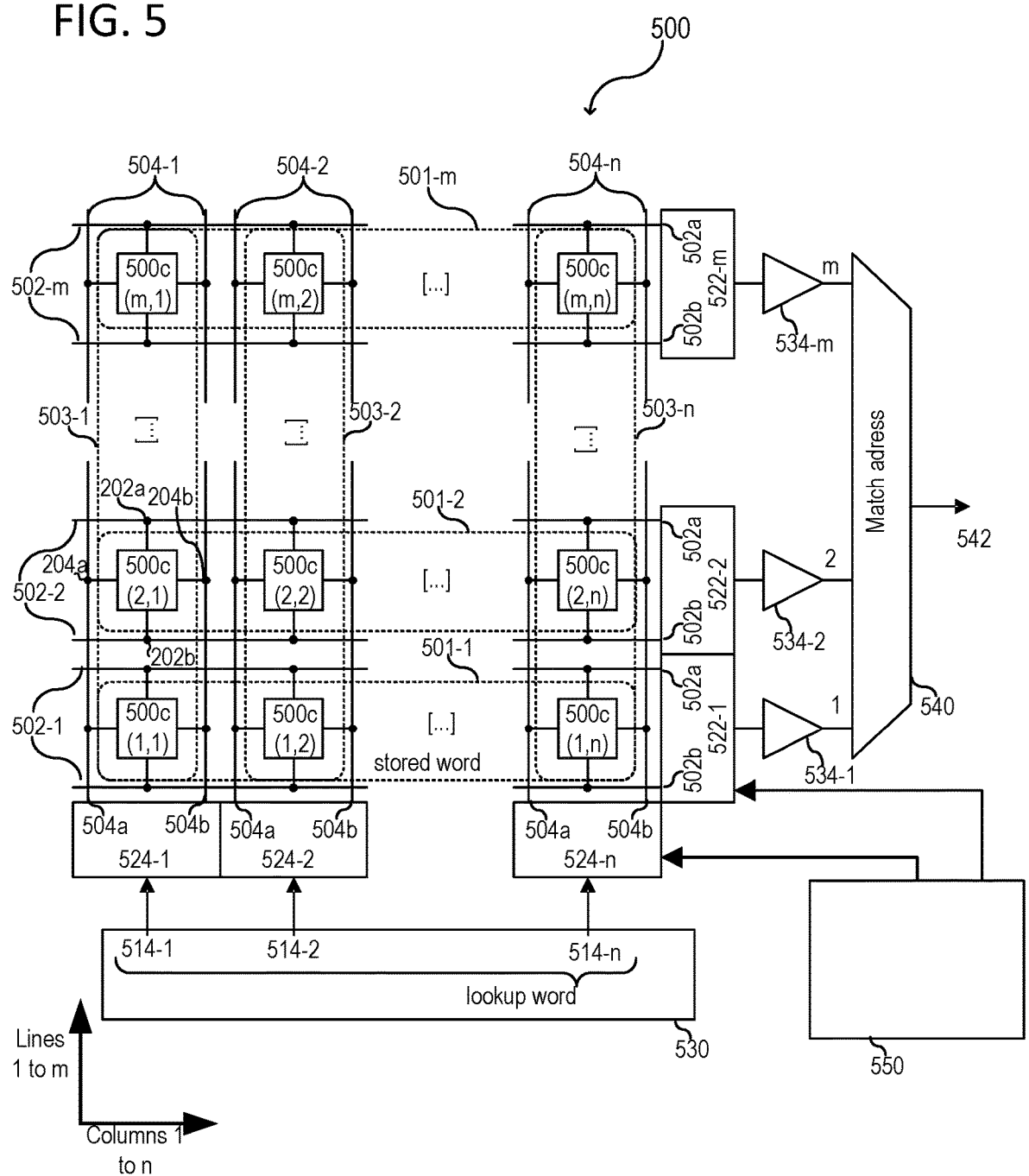
FIG. 5 shows a ternary memory cell arrangement in a schematic view, according to various embodiments.

FIG. 5 illustrates a ternary memory cell arrangement 500 in a schematic view, according to various embodiments. The ternary memory cell arrangement 500 may include a plurality of ternary memory cells 500c (also referred to as TCAM cells). Each of the plurality of ternary memory cells 500c may be configured as described herein for the ternary memory cell 200s having two remanent-polarizable memory cells 100 in a serial arrangement. Alternatively, each of the plurality of ternary memory cells 500c may be configured as described herein for the ternary memory cell 200p having two remanent-polarizable memory cells 100 in a parallel arrangement.

Further, the ternary memory cell arrangement 500 may include a plurality of lookup line pairs 504-1, 504-2, 504-n to provide lookup-signals 514-1, 514-2, 514-n to a number of m subsets 501-1, 501-2, 501-m (also referred to as first subsets) of the plurality of ternary memory cell 500c. According to various embodiments, each of the first subsets 501-1, 501-2, 501-m may represent a stored word with a length of n bits and the number of n lookup-signals 514-1, 514-2, 514-n may represent a word to lookup (or in other words a search word) with a length of n bits. Each of the first subsets 501-1, 501-2, 501-m may correspond to a distinct address (also referred to a match address 1, 2, m) at which a match and/or mismatch may be detected. Depending on the m stored words and the respective lookup word, all addresses may be determined for which the stored word matches with the respective lookup word.

According to various embodiments, the ternary memory cell arrangement 500 may include a match line pair 502-1, 502-2, 502-m for each of the one or more first subsets 501-1, 501-2, 501-m to detect a match and/or mismatch, e.g. to output a signal based on the lookup-signals 514-1, 514-2, 514-n and matching states (illustratively the respectively stored word) of a corresponding subset of the plurality of first subsets 501-1, 501-2, 501-m.

As illustrated in FIG. 5, a ternary memory cell arrangement 500 may include a plurality of ternary memory cells 500c, each ternary memory cell of the plurality of ternary memory cells 500c is switchable into a first matching state 312a, 412a, a second matching state 312b, 412b, and a third matching state 312c, 412c. Each ternary memory cell of the plurality of ternary memory cells 500c may include a first ferroelectric memory cell M1 and a second ferroelectric memory cell M2 in a parallel or serial arrangement, wherein each of the first ferroelectric memory cell M1 and the second ferroelectric memory cell M2 is switchable into a first ferroelectric memory cell state 112a and a second ferroelectric memory cell state 112b. Further, the first matching state 312a, 412a may be defined by the first ferroelectric memory cell M1 in the first ferroelectric memory cell state 112a and the second ferroelectric memory cell M2 in the second ferroelectric memory cell state 112b, the second matching state 312b, 412b may be defined by the first ferroelectric memory cell M1 in the second ferroelectric memory cell state 112b and the second ferroelectric memory cell M2 in the first ferroelectric memory cell state 112a, and the third matching state 312c, 412c may be defined by the first ferroelectric memory cell M1 and the second ferroelectric memory cell M2 being in the same ferroelectric memory cell state 112a, 112b, e.g. being both in the second ferroelectric memory cell state 112b.

According to various embodiments, the ternary memory cell arrangement 500 may include a plurality of match line drivers 522-1, 522-2, 522-m configured to address a plurality of first subsets 501-1, 501-2, 501-m of the plurality of ternary memory cells 500c via a plurality of match line pairs 502-1, 502-2, 502-m. Each match line driver of the plurality of match line drivers 522-1, 522-2, 522-m may be configured to drive a corresponding first subset of the plurality of first subsets 501-1, 501-2, 501-m via a corresponding match line pair of the plurality of match line pairs. In other words, each of the first subsets 501-1, 501-2, 501-m may be addressed individually via the corresponding match line pair 502-1, 502-2, 502-m.

According to various embodiments, each match line pair may include a first match line 502a and a second match line 502b. The first match line 502a may be connected to the first match line node 202a of each ternary memory cell 500c included in the corresponding subset and the second match line 502b may be connected to the second match line node 202b of each ternary memory cell 500c included in the corresponding subset. As an example, the respective first match line node 202a and second match line node 202b of the ternary memory cells (1,1), (1,2) to (1,n) may be connected to a common first match line 502a and a common second match line 502b respectively.

According to various embodiments, a plurality of sense amplifiers 534-1, 534-2, 534-m may be used to amplify a match and/or mismatch signal that may be passed through the corresponding match line drivers 522-1, 522-2, 522-m.

According to various embodiments, for the parallel arrangement, each ferroelectric memory cell M1, M2 of the corresponding first subset may be configured to, in the first ferroelectric memory cell state 112a, electrically conductively connect the first match line 502a to the second match line 502b in the case that a second lookup voltage is applied to the corresponding lookup node 204a, 204b and electrically isolate the first match line 502a from the second match line 502b in the case that a first lookup voltage is applied to the corresponding lookup node 204a, 204b, and, in the second ferroelectric memory cell state 112b, electrically isolate the first match line from the second match line for both cases either if the first lookup voltage or the second lookup voltage is applied to the corresponding lookup node 204a, 204b. Alternatively, for the serial arrangement, each ferroelectric memory cell M1, M2 of the corresponding first subset may be configured to, in the second ferroelectric memory cell state 112b, electrically conductively connect the first match line 502a to the second match line 502b in the case that a second lookup voltage is applied to the corresponding lookup node 204a, 204b and electrically isolate the first match line 502a from the second match line 502b in the case that a first lookup voltage is applied to the corresponding lookup node 204a, 204b, and, in the first ferroelectric memory cell state 112a, electrically conductively connect the first match line to the second match line for both cases either if the first lookup voltage or the second lookup voltage is applied to the corresponding lookup node 204a, 204b. The corresponding lookup node 204a, 204b is connected to the control terminal 102g of the respective remanent-polarizable memory cell M1, M2 of the ternary memory cell 500c.

According to various embodiments, the ternary memory cell arrangement 500 may include a plurality of lookup line drivers 524-1, 524-2, 524-n configured to drive a plurality of second subsets 503-1, 503-2, 503-n of the plurality of ternary memory cells 500c via a plurality of lookup line pairs 504-1, 504-2, 504-n. Each lookup line driver of the plurality of lookup line drivers 524-1, 524-2, 524-n may be configured to address a corresponding second subset of the plurality of second subsets 503-1, 503-2, 503-n via a corresponding lookup line pair of the plurality of lookup line pairs 504-1, 504-2, 504-n.

According to various embodiments, each lookup line pair of the plurality of lookup line pairs 504-1, 504-2, 504-n may include a first lookup line 504a and a second lookup line 504b, wherein the first lookup line 504a is connected to the first lookup node 204a of one or more corresponding ternary memory cells 500c and wherein the second lookup line 504b is connected to the second lookup node 204b of the one or more corresponding ternary memory cells 500c.

According to various embodiments, the respective lookup signal 514-1, 514-2, 514-n may include a first lookup voltage supplied to a first lookup line 504a of the corresponding lookup line pair and a second lookup voltage supplied to a second lookup line 504b of the corresponding lookup line pair. Thereby, the respective lookup signal 514-1, 514-2, 514-n may represent a first lookup-value, e.g. a logic "0". Alternatively, the respective lookup signal 514-1, 514-2, 514-n may include a second lookup voltage supplied to the first lookup line 504a and the first lookup voltage supplied to the second lookup line 504b. Thereby, the respective lookup signal 514-1, 514-2, 514-n may represent a second lookup-value, e.g. a logic "1".

According to various embodiments, a lookup circuit 530 may be used to send a lookup word (also referred to as search word) to the plurality of first subsets 501-1, 501-2, 501-m, each first subset of the plurality of first subsets 501-1, 501-2, 501-m may define a corresponding stored word.

Further, an address encoder 540 may be used to output an address signal 542 associated with a match and/or mismatch of the lookup word with the corresponding stored word of each of the plurality of first subsets 501-1, 501-2, 501-m.

According to various embodiments, one or more programming circuits 550 may be coupled to the plurality of match line drivers 522-1, 522-2, 522-m and the plurality of lookup line drivers 524-1, 524-2, 524-n and may be configured to program each of the plurality of ternary memory cells 500c, e.g. to thereby store the corresponding stored word in each of the plurality of first subsets 501-1, 501-2, 501-m.

According to various embodiments, the lookup line drivers 524-1, 524-2, 524-n may be configured to apply read voltages (e.g. the first lookup voltage and/or the second lookup voltage) during a read operation (also referred to as lookup operation) and programming voltages (e.g. VPP, ⅓ VPP, and/or ⅔ VPP) during write operations to the respective lookup lines 504a, 504b of the lookup line pairs 504-1, 504-2, 504-n.

According to various embodiments, the match line driver 522-1, 522-2, 522-m may be configured to apply programming voltages (e.g. VPP, ⅓ VPP, and/or ⅔ VPP) to the respective match lines 502a, 502b of the match line pairs 502-1, 502-2, 502m during write operations and to bypass the respective match line during a read operation to the respective sense amplifier 534-1, 534-2, 534-m. According to various embodiments, the address encoder 540 may be configured to convert sense amplifier outputs to an address signal 542 (the address signal may represent a binary address).

Figure 6A:
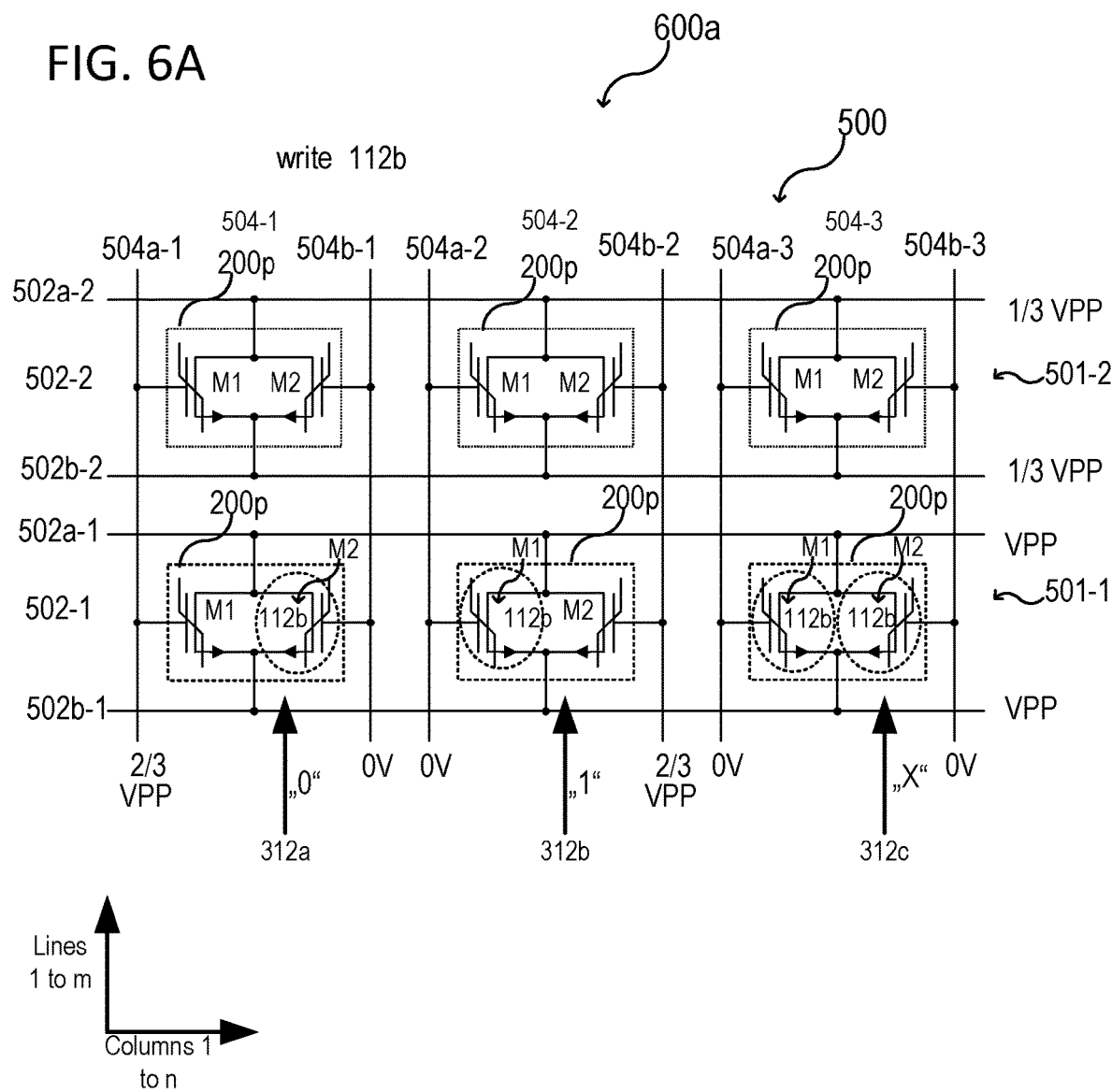
FIGS. 6A and 6B illustrate a programming scheme for programming a ternary memory cell arrangement, according to various embodiments.
Figure 6B:
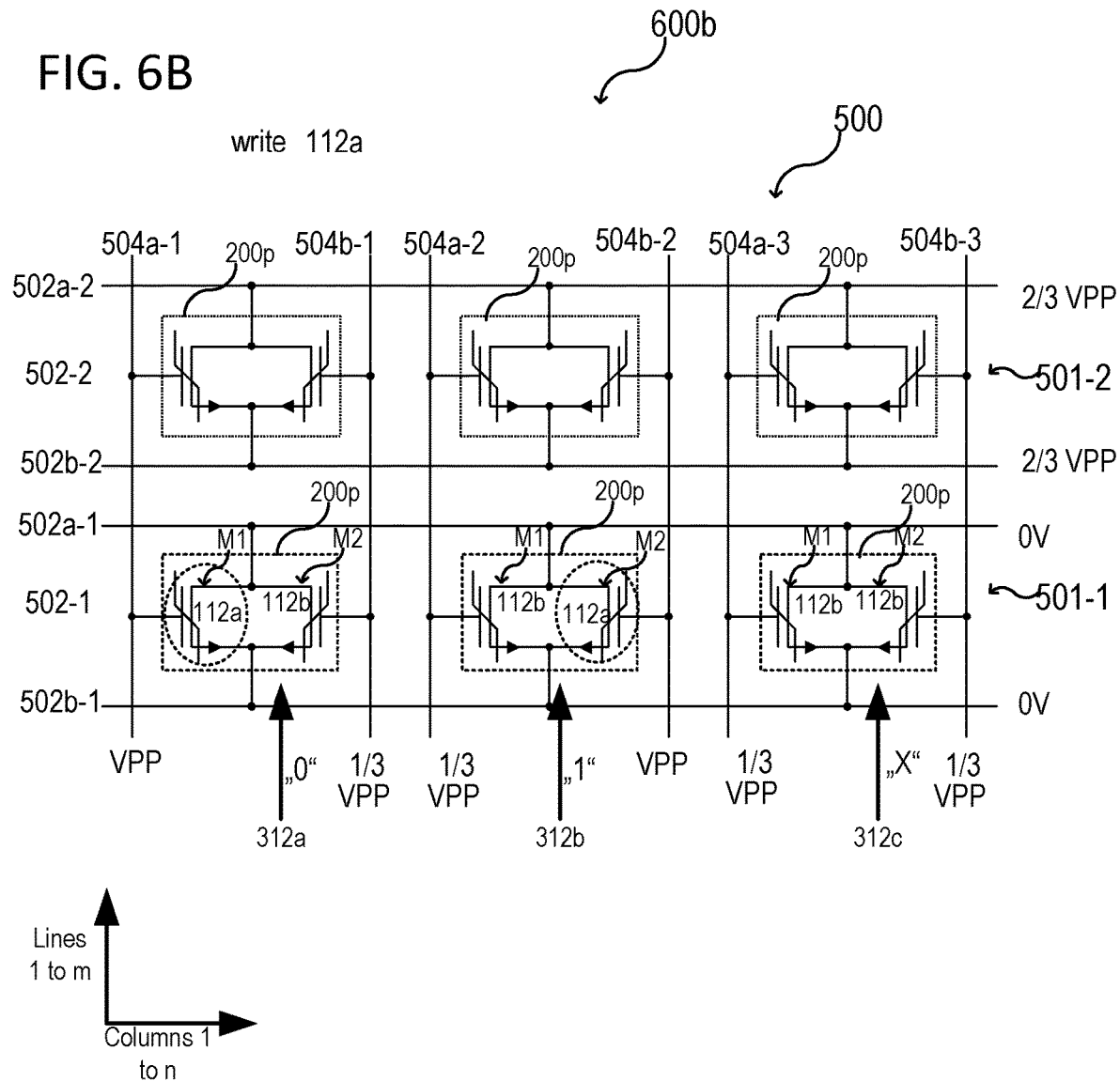

FIG. 6A and FIG. 6B show programming scheme for programming a ternary memory cell arrangement 500, according to various embodiments. In this example, the ternary memory cell arrangement 500 may include a plurality of ternary memory cells 200p, each of the ternary memory cells 200p having two remanent-polarizable memory cells M1, M2 in a parallel arrangement.

The programming scheme may include an erase operation or in other words a first write operation 600a and a program operation or in other words a second write operation 600b. The programming scheme may be carried out as VPP/3 scheme based on a programming voltage, VPP. Besides the programming voltage, VPP, two additional voltages ⅓×VPP and ⅔×VPP may be applied accordingly to program one or more remanent-polarizable memory cells 100.

The first write operation 600a may include writing the second memory state 112b for one or more remanent-polarizable memory cells M1, M2 of the respective ternary memory cell 200p. In this case, the programming voltage, VPP, may be applied at the match lines 502a-1, 502b-1 of the ternary memory cells 200p to be programmed and the additional voltage ⅓×VPP may be applied at the remaining match lines 502a-2, 502b-2. Further, zero volts may be applied at the lookup lines 504b-1, 504a-2, 504a-3, 504b-3 that are connected to the control terminals of the one or more remanent-polarizable memory cells M1, M2 to be programmed and the additional voltage ⅔×VPP may be applied at the remaining lookup lines 504a-1, 504b-2. Illustratively, each remanent-polarizable memory cell M1, M2 to be programmed may remain in its second memory state 112b or may be switch into its second memory state 112b by applying a programming voltage at the corresponding match lines while the corresponding lookup lines are tied to ground (or to another suitable reference potential).

The second write operation 600b may include writing the first memory state 112a for one or more remanent-polarizable memory cells M1, M2 of the respective ternary memory cell 200p. In this case, the programming voltage, VPP, may be applied at the lookup lines 504a-1, 504b-2 of the remanent-polarizable memory cells M1, M2 to be programmed and the additional voltage ⅓×VPP may be applied at the remaining lookup lines 504b-1, 504a-2, 504a-3, 504b-3. Further, zero volts may be applied at the match lines 502a-1, 502b-1 that are connected to ternary memory cells 200p to be programmed and the additional voltage ⅔×VPP may be applied at the remaining match lines 502a-2, 502b-2. Illustratively, each remanent-polarizable memory cell M1, M2 to be programmed may remain in its first memory state 112a or may be switch into its first memory state 112a by applying a programming voltage at the corresponding lookup lines while the corresponding match lines are tied to ground (or to another suitable reference potential).

As illustrated in FIG. 6B, after the first write operation 600a and the second write operation 600b are carried out, the ternary memory cells 200p may be programmed as desired. As an example, a first ternary memory cell 200p of the ternary memory cell arrangement 500 may be in its first matching state 312a, a second ternary memory cell 200p of the ternary memory cell arrangement 500 may be in its second matching state 312b, and a third ternary memory cell 200p of the ternary memory cell arrangement 500 may be in its third matching state 312c. As illustrated in FIG. 6B, the word "01X" is programmed into a first subset 501-1 of ternary memory cells 200p of the ternary memory cell arrangement 500. However, any other desired word may be programmed in a similar way.

Figure 7:
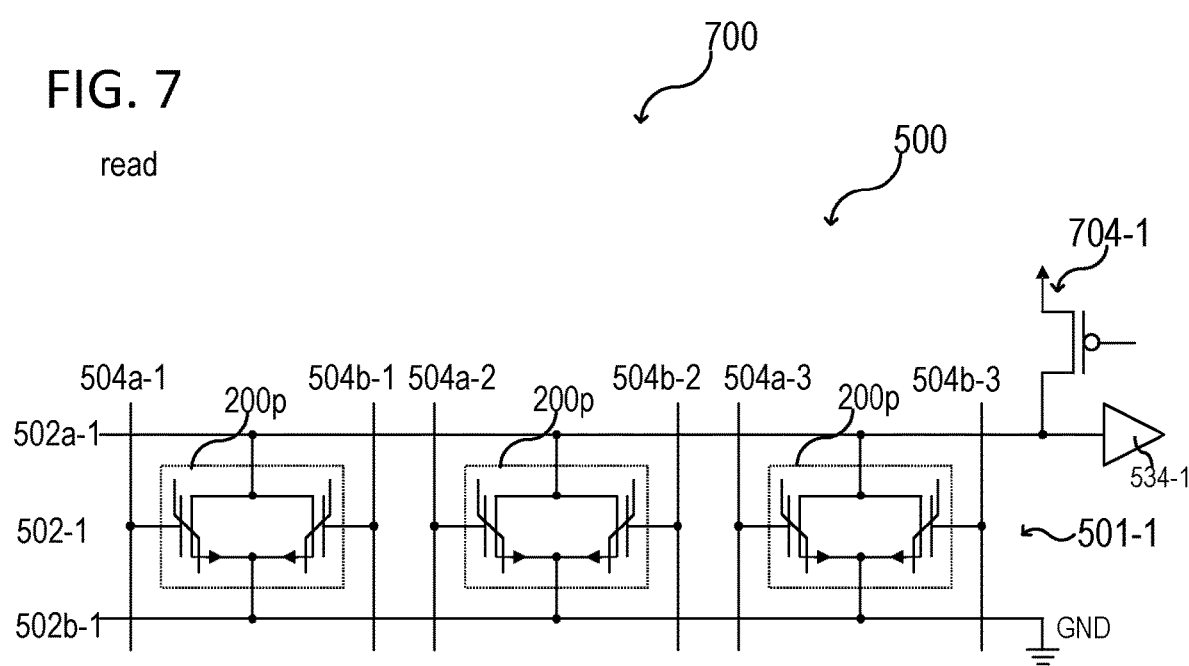
FIG. 7 illustrates a read operation for a read out of one or more ternary memory cells of a ternary memory cell arrangement, according to various embodiments.
Figure 7:
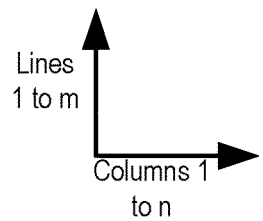

FIG. 7 shows a read operation 700 for the ternary memory cell arrangement 500, according to various embodiments. A match line pair 502-1 may be used to read out the corresponding subset 501-1 of ternary memory cells 200p in the ternary memory cell arrangement 500. In other words, the match line pair 502-1 may be used to output (e.g. to generate) a match and/or mismatch signal 332a, 332b based on the corresponding lookup-signals and the matching states (e.g. the matching states 312a, 312b, 312c) of a corresponding subset 501-1 of ternary memory cells 200p.

The read operation may include pre-charging a first match line 502a-1 of the respective match line pair 502-1. According to various embodiments, a pre-charge circuit 704-1 may be coupled to the first match line 502a-1 of the match line pair 502-1 to pre-charge the first match line 502a-1 to a pre-defined read voltage. According to various embodiments, the read voltage may be less than the programming voltage. The pre-charged first match line 502a-1 may be discharged to the corresponding second match line 502b-1 of the match line pair 502-1 in the case that at least one ternary memory cell 200p of the subset 501-1 (e.g. of the stored word) shows a mismatch. The second match line 502b-1 of the match line pair 502-1 may be tied to ground GND or another suitable reference potential. The pre-charge circuit 704-1 may include one or more transistors configured to selectively couple the first match line 502a-1 to an electrical pre-charge potential. However, any other suitable circuit may be used to pre-charge the first match line 502a-1 to a pre-defined read voltage.

The voltage of the pre-charged first match line 502a-1 may be sensed by at least one sense amplifier 534-1. Illustratively, the voltage of the pre-charged first match line 502a-1 may be used as a signal that represents a match and/or mismatch of the stored word with a lookup word. In the case that the voltage of the pre-charged first match line 502a-1 remains the same, e.g. substantially the read voltage applied during the pre-charging, the stored word matches with the lookup word; and, in the other case, e.g. if the voltage of the pre-charged first match line 502a-1 is changed (e.g. reduced), the stored word does not match with the lookup word.

According to various embodiments, the ternary memory cell 200s having two remanent-polarizable memory cells M1, M2 in a serial arrangement may be programmed and read in a similar way, e.g. by applying the respective voltages at the corresponding nodes of the respective ternary memory cell 200s.

In the following, various examples are provided that refer to the figures and embodiments described above.

Example 1 is a ternary memory cell 200p including: a first remanent-polarizable memory cell M1 including a first terminal 102a, a second terminal 102b, and a control terminal 102g to control an electrical behavior of the first terminal 102a and the second terminal 102b of the first remanent-polarizable memory cell M1; a second remanent-polarizable memory cell M2 including a first terminal 102a, a second terminal 102b, and a control terminal 102g to control an electrical behavior of the first terminal 102a and the second terminal 102b of the second remanent-polarizable memory cell M2; a first match line node 202a and a second match line node 202b to connect the ternary memory cell 200p to a first match line 502a and second match line 502b respectively; and a first lookup node 204a and a second lookup node 204b to connect the ternary memory cell 200p to a first lookup line 504a and a second lookup line 504b respectively, wherein the first terminal 102a of the first remanent-polarizable memory cell M1 and the first terminal 102a of the second remanent-polarizable memory cell M2 are electrically connected to the first match line node 202a and wherein the second terminal 102b of the first remanent-polarizable memory cell M1 and the second terminal 102b of the second remanent-polarizable memory cell M2 are electrically connected to the second match line node 202b, and wherein the control terminal 102g of the first remanent-polarizable memory cell M1 is electrically connected to the first lookup node 204a and wherein the control terminal 102g of the second remanent-polarizable memory cell M2 is electrically connected to the second lookup node 204b.

According to various embodiments, control the electrical behavior of the first terminal 102a and the second terminal 102b of the respective remanent-polarizable memory cell M1, M2 may include switching the remanent-polarizable memory cell M1, M2 into an electrically conducting state (also referred to as "on") and/or into an electrically non-conducting (e.g. isolating) state (also referred to as "off").

In example 2, the ternary memory cell of example 1 may further include that the first remanent-polarizable memory cell M1 includes a first memory state 112a (e.g. a low threshold voltage state, LVT) and a second memory state 112b (e.g. a high threshold voltage state, HVT) and that the second remanent-polarizable memory cell M2 includes a first memory state 112a (e.g. a low threshold voltage state) and a second memory state 112b (e.g. a high threshold voltage state).

According to various embodiments, the first memory state 112a (LVT) and the second memory state 112b (HVT) are distinct, e.g. differing in the threshold voltage at which the remanent-polarizable memory cell 100 can be switched on and off.

In example 3, the ternary memory cell of example 2 may further include that the ternary memory cell 200p includes three matching states 312a, 312b, 312c (also referred to as "0", "1", and "X") generated by distinct combinations of the first memory state 112a and the second memory state 112b of the first remanent-polarizable memory cell M1 and the first memory state 112a and the second memory state 112b of the second remanent-polarizable memory cell M2. According to various embodiments, the three matching states 312a, 312b, 312c are also referred to as first matching state 312a, second matching state 312b, and third matching state 312c.

In example 4, the ternary memory cell of example 2 or 3 may further include that a first matching state 312a of the ternary memory cell 200p includes the first remanent-polarizable memory cell M1 in its first memory state 112a and the second remanent-polarizable memory cell M2 in its second memory state 112b. Further, a second matching state 312b of the ternary memory cell 200p may include the first remanent-polarizable memory cell M1 in its second memory state 112b and the second remanent-polarizable memory cell M2 in its first memory state 112a. Further, a third matching state 312c of the ternary memory cell 200p may include the first remanent-polarizable memory cell M1 in its second memory state 112b and the second remanent-polarizable memory cell M2 in its second memory state 112b.

In example 5, the ternary memory cell of any one of examples 2 to 4 may further include that in the first memory state 112a, the first remanent-polarizable memory cell M1 is configured to electrically isolate the first match line node 202a and the second match line node from one another in the case that a first lookup voltage (e.g., VG0) is applied to the first lookup node 204a and to provide a conductive path between the first match line node 202a and the second match line node 202b in the case that a second lookup voltage (e.g., VG1) is applied to the first lookup node 204a. Further, in the second memory state 112b, the first remanent-polarizable memory cell M1 is configured to electrically isolate the first match line node 202a and the second match line node 202b from one another in the case that the first lookup voltage (e.g., VG0) is applied to the first lookup node 204a and as well as in the case that the second lookup voltage (e.g., VG1) is applied to the first lookup node 204a.

In example 6, the ternary memory cell of any one of examples 2 to 5 may further include that in the first memory state 112a, the second remanent-polarizable memory cell M2 is configured to electrically isolate the first match line node 202a and the second match line node 202b from one another in the case that a first lookup voltage (e.g., VG0) is applied to the second lookup node 204b and to provide a conductive path between the first match line node 202a and the second match line node 202b in the case that a second lookup voltage (e.g., VG1) is applied to the second lookup node 204b; and that, in the second memory state 112b, the second remanent-polarizable memory cell M2 is configured to electrically isolate the first match line node 202a and the second match line node 202b from one another in the case that the first lookup voltage (e.g., VG0) is applied to the second lookup node 204b and as well as in the case that the second lookup voltage (e.g., VG1) is applied to the second lookup node 204b.

According to various embodiments, the first lookup voltage (e.g., VG0) and the second lookup voltage (e.g., VG1) are distinct from one another. As an example, the second lookup voltage (e.g., VG1) may be substantially equal to a first threshold voltage VL corresponding to the first memory state 112a and the first lookup voltage (e.g., VG0) may be less than the second lookup voltage (e.g. VG1).

In example 7, the ternary memory cell of example 5 or 6 may further include that each of the first remanent-polarizable memory cell M1 and the second remanent-polarizable memory cell M2 includes a first threshold voltage (also referred to as VL) associated with the first memory state 112a (also referred to as LVT) and a second threshold voltage (also referred to as VH) associated with the second memory state 112b (also referred to as HVT).

In example 8, the ternary memory cell of example 7 may further include that the first lookup voltage (e.g., VG0) is less than the first threshold voltage (VL). Further, the second lookup voltage (e.g., VG1) may be equal to or greater than the first threshold voltage (VL). Further, the second lookup voltage (e.g., VG1) may be less than the second threshold voltage (VH).

In example 9, the ternary memory cell of any one of examples 1 to 8 may further include that each of the first remanent-polarizable memory cell M1 and the second remanent-polarizable memory cell M2 includes at least one layer of a remanent polarizable material.

In example 10, the ternary memory cell of any one of examples 1 to 9 may further include that each of the first remanent-polarizable memory cell M1 and the second remanent-polarizable memory cell M2 is a ferroelectric memory cell including at least one layer of a ferroelectric material. The ferroelectric material may include ferroelectric hafnium oxide.

In example 11, the ternary memory cell of any one of examples 1 to 10 may further include that each of the first remanent-polarizable memory cell M1 and the second remanent-polarizable memory cell M2 includes a ferroelectric field effect transistor structure.

Example 12 is a ternary memory cell including: a first match line node 202a, a second match line node 202b, a first lookup node 204a, and a second lookup node 204b; a first remanent-polarizable memory cell M1 including a first terminal 102a, a second terminal 102b, and a control terminal 102g to control the electrical behavior of the first terminal 102a and the second terminal 102b of the first remanent-polarizable memory cell M1; a second remanent-polarizable memory cell M2 including a first terminal 102a, a second terminal 102b, and a control terminal 102g to control the electrical behavior of the first terminal 102a and the second terminal 102b of the second remanent-polarizable memory cell M2; wherein the first terminal 102a of the first remanent-polarizable memory cell M1 is electrically connected to the first match line node 202a, wherein the second terminal 102b of the second remanent-polarizable memory cell M2 is electrically connected to the second match line node 202b, and wherein the second terminal 102b of the first remanent-polarizable memory cell M1 and the first terminal 102a of the second remanent-polarizable memory cell M2 are electrically connected with one another, and wherein the control terminal 102g of the first remanent-polarizable memory cell M1 is electrically connected to the first lookup node 204a and wherein the control terminal 102g of the second remanent-polarizable memory cell M2 is electrically connected to the second lookup node 204b.

According to various embodiments, control the electrical behavior of the first terminal 102a and the second terminal 102b of the respective remanent-polarizable memory cell M1, M2 may include switching the remanent-polarizable memory cell M1, M2 into an electrically conducting state (also referred to as "on") and/or into an electrically non-conducting (e.g. isolating) state (also referred to as "off").

In example 13, the ternary memory cell of example 12 may further include that the first remanent-polarizable memory cell M1 includes a first memory state 112a (e.g. a low threshold voltage state, LVT) and a second memory state 112b (e.g. a high threshold voltage state, HVT) and that the second remanent-polarizable memory cell M2 includes a first memory state 112a (e.g. a low threshold voltage state) and a second memory state 112b (e.g. a high threshold voltage state).

According to various embodiments, the first memory state 112a (LVT) and the second memory state 112b (HVT) are distinct, e.g. differing in the threshold voltage at which the remanent-polarizable memory cell 100 can be switched on and off.

In example 14, the ternary memory cell of example 13 may further include that the ternary memory cell 200p includes three matching states 312a, 312b, 312c (also referred to as "0", "1", and "X") generated by distinct combinations of the first memory state 112a and the second memory state 112b of the first remanent-polarizable memory cell M1 and the first memory state 112a and the second memory state 112b of the second remanent-polarizable memory cell M2. According to various embodiments, the three matching states 312a, 312b, 312c are also referred to as first matching state 312a, second matching state 312b, and third matching state 312c.

In example 15, the ternary memory cell of any one of examples 12 to 14 may further include that a first matching state 312a of the ternary memory cell 200s includes the first remanent-polarizable memory cell M1 in its second memory state 112b and the second remanent-polarizable memory cell M2 in its first memory state 112a. Further, a second matching state 312b of the ternary memory cell 200s may include the first remanent-polarizable memory cell M1 in its first memory state 112a and the second remanent-polarizable memory cell M2 in its second memory state 112b. Further, a third matching state 312c of the ternary memory cell 200s may include the first remanent-polarizable memory cell M1 in its second memory state 112b and the second remanent-polarizable memory cell M2 in its second memory state 112b.

In example 16, the ternary memory cell of any one of examples 12 to 15 may further include that, in the first memory state 112a, the first remanent-polarizable memory cell M1 is configured to allow a current flow between its first terminal 102a and second terminal 102b (in other words the terminals 102a, 102b may be electrically conductively connected with one another) in the case that a first lookup voltage (e.g., VG1) is applied to the first lookup node 204a and as well as in the case that a second lookup voltage (e.g., VG2) is applied to the first lookup node 204a. Further, in the second memory state 112b, the first remanent-polarizable memory cell M1 may be configured to prevent a current flow between its first terminal 102a and second terminal 102b (in other words the terminals 102a, 102b may be electrically isolated from one another) in the case that the first lookup voltage (e.g., VG1) is applied to the first lookup node 204a and to allow a current flow between its first terminal 102a and second terminal 102b (in other words the terminals 102a, 102b may be electrically conductively connected with one another) in the case that the second lookup voltage (e.g., VG2) is applied to the first lookup node 204a.

In example 17, the ternary memory cell of any one of examples 12 to 16 may further include that, in the first memory state 112a, the second remanent-polarizable memory cell M2 is configured to allow a current flow between its first terminal 102a and second terminal 102b (in other words the terminals 102a, 102b may be electrically conductively connected with one another) in the case that the first lookup voltage (e.g., VG1) is applied to the second lookup node 204b and as well as in the case that the second lookup voltage (e.g., VG2) is applied to the second lookup node 204b. Further, in the second memory state 112b, the second remanent-polarizable memory cell M2 may be configured to prevent a current flow between its first terminal 102a and second terminal 102b (in other words the terminals 102a, 102b may be electrically isolated from one another) in the case that the first lookup voltage (e.g., VG1) is applied to the second lookup node 204b and to allow a current flow between its first terminal 102a and second terminal 102b (in other words the terminals 102a, 102b may be electrically conductively connected with one another) in the case that the second lookup voltage (e.g., VG2) is applied to the second lookup node 204b.

In example 18, the ternary memory cell of example 16 or 17 may further include that each of the first remanent-polarizable memory cell M1 and the second remanent-polarizable memory cell M2 includes a first threshold voltage VL associated with the first memory state 112a and a second threshold voltage HL associated with the second memory state 112b. According to various embodiments, the first lookup voltage (e.g., VG1) and the second lookup voltage (e.g., VG2) are distinct from one another. As an example, the first lookup voltage (e.g., VG1) may be substantially equal to a first threshold voltage VL corresponding to the first memory state 112a and the second lookup voltage (e.g., VG2) may be greater than the first lookup voltage (e.g., VG1). The second lookup voltage (e.g., VG2) may be substantially equal to a second threshold voltage VL corresponding to the second memory state 112b.

In example 19, the ternary memory cell of example 18 may further include that the first lookup voltage (e.g., VG1) is equal to or greater than the first threshold voltage VL and that the second lookup voltage (e.g., VG2) is equal to or greater than the second threshold voltage VH.

In example 20, the ternary memory cell of any one of examples 12 to 19 may further include that each of the first remanent-polarizable memory cell M1 and the second remanent-polarizable memory cell M2 includes at least one layer of a remanent polarizable material.

In example 21, the ternary memory cell of any one of examples 12 to 20 may further include that each of the first remanent-polarizable memory cell M1 and the second remanent-polarizable memory cell M2 is a ferroelectric memory cell including at least one layer of a ferroelectric material. The ferroelectric material may include ferroelectric hafnium oxide.

In example 22, the ternary memory cell of any one of examples 12 to 21 may further include that each of the first remanent-polarizable memory cell M1 and the second remanent-polarizable memory cell M2 includes a ferroelectric field effect transistor structure.

Example 23 is a ternary memory cell arrangement 500 including: one or more ternary memory cells 200s, 200p according to any one of examples 1 to 22, wherein each of the one or more ternary memory cells is individually addressable via a match line pair 502 and a lookup line pair 504.

Example 24 is a ternary memory cell arrangement 500 including: a plurality of ternary memory cells 200s, 200p according to any one of examples 1 to 22; a plurality of lookup line pairs 504-1, 504-2, 504-n to provide lookup-signals 514-1, 514-2, 514-n to one or more subsets 501-1, 501-2, 501-m of the plurality of ternary memory cells; and a match line pair 502-1, 502-2, 502-m for each of the one or more subsets 501-1, 501-2, 501-m to output a match or mismatch signal based on the lookup signals 514-1, 514-2, 514-n and matching states 312a, 312b, 312c of a corresponding subset of the one or more subsets 501-1, 501-2, 501-m (m and n may be natural numbers equal to one or greater than 1).

In example 25, the ternary memory cell arrangement 500 of example 24 may further include that the respective match line pair 502 includes a first match line 502a connected to the respective first match line node 202a of the corresponding subset 501 of ternary memory cells and a second match line 502b (also referred to as discharge line) connected to the respective second match line node 202b of the corresponding subset 501 of ternary memory cells.

In example 26, the ternary memory cell arrangement 500 of example 25 may further include: a pre-charge circuit 704-1 configured to pre-charge each first match line 502a-1 and a sense amplifier 534-1 to detect the match or mismatch event associated with the corresponding subset 501-1 based on a non-discharge or a discharge of the respective first match line 502a-1 to the second match line 502a-2.

In example 27, the ternary memory cell arrangement 500 of any one of examples 24 to 26 may further include: a programming circuit 550 configured to store a word in the corresponding subset 501-1, 501-2, 501-m of ternary memory cells via the lookup line pairs 504-1, 504-2, 504-n and the corresponding match line pairs 502-1, 502-2, 502-m.

In example 28, the ternary memory cell arrangement 500 of any one of examples 24 to 27 may further include that each lookup line pair of the plurality of lookup line pairs 504-1, 504-2, 504-n includes a first lookup line 504a and a second lookup line 504b, wherein the first lookup line 504a is connected to the first lookup node 204a of one or more corresponding ternary memory cells of a second subset 503-1, 503-2, 503-n and wherein the second lookup line 504b is connected to the second lookup node 204b of the one or more corresponding ternary memory cells of the second subset 503-1, 503-2, 503-n.

In example 29, the ternary memory cell arrangement 500 of any one of examples 24 to 28 may further include that a respective lookup signal 514-1, 514-2, 514-n includes a first lookup voltage supplied to the first lookup line 504a and a second lookup voltage supplied to the second lookup line 504b thereby representing a first lookup-value (also referred to as logic "0"); or wherein the respective lookup signal 514-1, 514-2, 514-n includes the second lookup voltage supplied to the first lookup line 504a and the first lookup voltage supplied to the second lookup line 504b thereby representing a second lookup-value (also referred to as logic "1").

Example 30 is a ternary memory cell arrangement 500 including: a plurality of ternary memory cells 200s, 200p, each ternary memory cell of the plurality of ternary memory cells 200s, 200p is switchable into a first matching state 312a, a second matching state 312b, and a third matching state 312c, wherein each ternary memory cell of the plurality of ternary memory cells 200s, 200p includes: a first ferroelectric memory cell M1 and a second ferroelectric memory cell M2 in a parallel or serial arrangement, wherein each of the first ferroelectric memory cell M1 and the second ferroelectric memory cell M2 is switchable into a first (e.g. pre-defined) ferroelectric memory cell state 112a and a second (e.g. pre-defined) ferroelectric memory cell state 112b; and wherein the first matching state 312a is defined by the first ferroelectric memory cell M1 in the first ferroelectric memory cell state 112a and the second ferroelectric memory cell M2 in the second ferroelectric memory cell state 112b, wherein the second matching state 312b is defined by the first ferroelectric memory cell M1 in the second ferroelectric memory cell state 112b and the second ferroelectric memory cell M2 in the first ferroelectric memory cell state 112a, and wherein the third matching state 312c is defined by the first ferroelectric memory cell M1 and the second ferroelectric memory cell M2 being in the same ferroelectric memory cell state. According to various embodiments, the third matching state 312c may be defined by the first ferroelectric memory cell M1 and the second ferroelectric memory cell M2 being both in their second ferroelectric memory cell state 112b.

In example 31, the ternary memory cell arrangement of example 30 may further include: a plurality of match line drivers 522-1, 522-2, 522-m configured to address a plurality of first subsets 501-1, 501-2, 501-m of the plurality of ternary memory cells via a plurality of match line pairs 502-1, 502-2, 502-m. As an example, each of the plurality of match line pairs 502-1, 502-2, 502-m may be associated with (e.g. only) one of the first subsets 501-1, 501-2, 501-m.

In example 32, the ternary memory cell arrangement of example 31 may further include that each of the plurality of match line pairs 502-1, 502-2, 502-m includes a first match line 502a and a second match line 502b.

In example 33, the ternary memory cell arrangement of example 32 may further include that, in the case of the parallel arrangement, each ferroelectric memory cell M1, M2 of the corresponding first subset 501 is configured to, in the first ferroelectric memory cell state 112a, electrically conductively connect the first match line 502a to the second match line 502b in the case that a second lookup voltage is applied to a corresponding control terminal 102g of the ferroelectric memory cell M1, M2 and to electrically isolate the first match line 502a from the second match line 502b in the case that a first lookup voltage is applied to the corresponding control terminal 102g, and, in the second ferroelectric memory cell state 112b, electrically isolate the first match line 502a from the second match line 502b for both cases either if the first lookup voltage or the second lookup voltage is applied to the corresponding control terminal.

In example 34, the ternary memory cell arrangement of example 32 may further include that, in the case of the serial arrangement, each ferroelectric memory cell M1, M2 of the corresponding first subset is configured to, in the second ferroelectric memory cell state 112b, electrically conductively connect the first match line 502a to the second match line 502b in the case that a second lookup voltage is applied to a corresponding control terminal 102g of the ferroelectric memory cell M1, M2 and to electrically isolate the first match line 502a from the second match line 502b in the case that a first lookup voltage is applied to the corresponding control terminal 102g, and, in the first ferroelectric memory cell state 112a, electrically conductively connect the first match line 502a to the second match line 502b for both cases either if the first lookup voltage or the second lookup voltage is applied to the corresponding control terminal.

In example 35, the ternary memory cell arrangement of any one of examples 30 to 34 may further include: a plurality of lookup line drivers 524-1, 524-2, 524-n configured to drive a plurality of second subsets 503-1, 503-2, 503-n of the plurality of ternary memory cells via a plurality of lookup line pairs 504-1, 504-2, 504-n. As an example, each of the plurality of lookup line pairs 504-1, 504-2, 504-n may be associated with (e.g. only) one of the second subsets 503-1, 503-2, 503-n.

Illustratively, the ternary memory cell arrangement may include an (m,n)-array of ternary memory cells, wherein m and n are natural numbers. The (m,n)-array may include, for example, m lines and n columns.

In example 36, the ternary memory cell arrangement of any one of examples 30 to 35 may further include: a lookup circuit 530 coupled to the plurality of lookup line drivers 524-1, 524-2, 524-n and configured to send a lookup word to the plurality of first subsets 501-1, 501-2, 501-m, each first subset of the plurality of first subsets 501-1, 501-2, 501-m defines a corresponding stored word.

In example 37, the ternary memory cell arrangement of example 36 may further include: an address encoder 540 coupled to the plurality of match line drivers 522-1, 522-2, 522-m and configured to output an address signal 542 associated with a match or mismatch of the lookup word with the corresponding stored word of each of the plurality of first subsets 501-1, 501-2, 501-m.

In example 38, the ternary memory cell arrangement of any one of examples 30 to 37 may further include: one or more programming circuits 550 coupled to the plurality of match line drivers 522-1, 522-2, 522-m and the plurality of lookup line drivers 524-1, 524-2, 524-n and configured to program each of the plurality of ternary memory cells 200s, 200p and to thereby store the corresponding stored word in each of the plurality of first subsets 501-1, 501-2, 501-m.

Various embodiments may be related to a remanent-polarizable layer or a remanent-polarizable material, however, the term "remanent-polarizable" may be understood as "spontaneously-polarizable" and vice versa.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:
1. A ternary memory cell comprising:
a first remanent-polarizable memory cell comprising a first terminal, a second terminal, and a control terminal to control an electrical behavior of the first terminal and the second terminal of the first remanent-polarizable memory cell;
a second remanent-polarizable memory cell comprising a first terminal, a second terminal, and a control terminal to control an electrical behavior of the first terminal and the second terminal of the second remanent-polarizable memory cell;

a first match line node and a second match line node to connect the ternary memory cell to a first match line and a second match line respectively; and a first lookup node and a second lookup node to connect the ternary memory cell to a first lookup line and a second lookup line respectively, wherein the first terminal of the first remanent-polarizable memory cell and the first terminal of the second remanent-polarizable memory cell are electrically connected to the first match line node and wherein the second terminal of the first remanent-polarizable memory cell and the second terminal of the second remanent-polarizable memory cell are electrically connected to the second match line node, and wherein the control terminal of the first remanent-polarizable memory cell is electrically connected to the first lookup node and wherein the control terminal of the second remanent-polarizable memory cell is electrically connected to the second lookup node.

2. The ternary memory cell of claim 1, wherein the first remanent-polarizable memory cell comprises a first memory state and a second memory state and wherein the second remanent-polarizable memory cell comprises a first memory state and a second memory state.

3. The ternary memory cell of claim 2, wherein the ternary memory cell comprises three matching states generated by distinct combinations of the first memory state and the second memory state of the first remanent-polarizable memory cell and the first memory state and the second memory state of the second remanent-polarizable memory cell.

4. The ternary memory cell of claim 2, wherein a first matching state of the ternary memory cell comprises the first remanent-polarizable memory cell in the first memory state and the second remanent-polarizable memory cell in the second memory state, wherein a second matching state of the ternary memory cell comprises the first remanent-polarizable memory cell in the second memory state and the second remanent-polarizable memory cell in the first memory state, and wherein a third matching state of the ternary memory cell comprises the first remanent-polarizable memory cell in the second memory state and the second remanent-polarizable memory cell in the second memory state.

5. The ternary memory cell of claim 2, wherein, in the first memory state, the first remanent-polarizable memory cell is configured to electrically isolate the first match line node and the second match line node from one another in the case that a first lookup voltage is applied to the first lookup node and provide a conductive path between the first match line node and the second match line node in the case that a second lookup voltage is applied to the first lookup node; and, wherein, in the second memory state, the first remanent-polarizable memory cell is configured to electrically isolate the first match line node and the second match line node from one another in the case that the first lookup voltage is applied to the first lookup node and in the case that the second lookup voltage is applied to the first lookup node.

6. The ternary memory cell of claim 5, wherein, in the first memory state, the second remanent-polarizable memory cell is configured to electrically isolate the first match line node and the second match line node from one another in the case that the first lookup voltage is applied to the second lookup node and provide a conductive path between the first match line node and the second match line node in the case that the second lookup voltage is applied to the second lookup node; and, wherein, in the second memory state, the second remanent-polarizable memory cell is configured to electrically isolate the first match line node and the second match line node from one another in the case that the first lookup voltage is applied to the second lookup node and in the case that the second lookup voltage is applied to the second lookup node.

7. The ternary memory cell of claim 5, wherein each of the first remanent-polarizable memory cell and the second remanent-polarizable memory cell comprises a first threshold voltage associated with the first memory state and a second threshold voltage associated with the second memory state.

8. The ternary memory cell of claim 7, wherein the first lookup voltage is less than the first threshold voltage and wherein the second lookup voltage is equal to or greater than the first threshold voltage and less than the second threshold voltage.

9. A ternary memory cell comprising:

a first match line node, a second match line node, a first lookup node, and a second lookup node;

a first remanent-polarizable memory cell comprising a first terminal, a second terminal, and a control terminal to control an electrical behavior of the first terminal and the second terminal of the first remanent-polarizable memory cell; and a second remanent-polarizable memory cell comprising a first terminal, a second terminal, and a control terminal to control an electrical behavior of the first terminal and the second terminal of the second remanent-polarizable memory cell, wherein the first terminal of the first remanent-polarizable memory cell is electrically connected to the first match line node, wherein the second terminal of the second remanent-polarizable memory cell is electrically connected to the second match line node, and wherein the second terminal of the first remanent-polarizable memory cell and the first terminal of the second remanent-polarizable memory cell are electrically connected with one another, and wherein the control terminal of the first remanent-polarizable memory cell is electrically connected to the first lookup node and wherein the control terminal of the second remanent-polarizable memory cell is electrically connected to the second lookup node.

10. The ternary memory cell of claim 9, wherein the first remanent-polarizable memory cell comprises a first memory state and a second memory state and wherein the second remanent-polarizable memory cell comprises a first memory state and a second memory state.

11. The ternary memory cell of claim 10, wherein the ternary memory cell comprises three matching states generated by distinct combinations of the first memory state and the second memory state of the first remanent-polarizable memory cell and the first memory state and the second memory state of the second remanent-polarizable memory cell.

12. The ternary memory cell of claim 11,
wherein a first matching state of the ternary memory cell comprises the first remanent-polarizable memory cell in the second memory state and the second remanent-polarizable memory cell in the first memory state,
wherein a second matching state of the ternary memory cell comprises the first remanent-polarizable memory cell in the first memory state and the second remanent-polarizable memory cell in the second memory state, and
wherein a third matching state of the ternary memory cell comprises the first remanent-polarizable memory cell in the second memory state and the second remanent-polarizable memory cell in the second memory state.

13. The ternary memory cell of claim 11,
wherein, in the first memory state, the first remanent-polarizable memory cell is configured to allow a current flow between its first terminal and second terminal in the case that a first lookup voltage is applied to the first lookup node and in the case that a second lookup voltage is applied to the first lookup node, and,
wherein, in the second memory state, the first remanent-polarizable memory cell is configured to
prevent a current flow between its first terminal and second terminal in the case that the first lookup voltage is applied to the first lookup node and
allow a current flow between its first terminal and second terminal in the case that the second lookup voltage is applied to the first lookup node.

14. The ternary memory cell of claim 13,
wherein, in the first memory state, the second remanent-polarizable memory cell is configured to allow a current flow between its first terminal and second terminal in the case that the first lookup voltage is applied to the second lookup node and in the case that the second lookup voltage is applied to the second lookup node, and,
wherein, in the second memory state, the second remanent-polarizable memory cell is configured to
prevent a current flow between its first terminal and second terminal in the case that the first lookup voltage is applied to the second lookup node and
allow a current flow between its first terminal and second terminal in the case that the second lookup voltage is applied to the second lookup node.

15. The ternary memory cell of claim 13,
wherein each of the first remanent-polarizable memory cell and the second remanent-polarizable memory cell comprises a first threshold voltage associated with the first memory state and a second threshold voltage associated with the second memory state.

16. The ternary memory cell of claim 15,
wherein the first lookup voltage is equal to or greater than the first threshold voltage and that the second lookup voltage is equal to or greater than the second threshold voltage.

17. A ternary memory cell arrangement comprising:
a plurality of ternary memory cells;
a lookup circuit coupled to a plurality of lookup line drivers and configured to send a lookup word to a plurality of first subsets of the plurality of ternary memory cells, each first subset of the plurality of first subsets defines a corresponding stored word; and
an address encoder coupled to a plurality of match line drivers and configured to output an address signal associated with a match or mismatch of the lookup word with the corresponding stored word of each of the plurality of first subsets,
wherein each ternary memory cell of the plurality of ternary memory cells is switchable into a first matching state, a second matching state, and a third matching state, wherein each ternary memory cell of the plurality of ternary memory cells comprises:
a first ferroelectric memory cell and a second ferroelectric memory cell in a parallel arrangement or a serial arrangement, wherein each of the first ferroelectric memory cell and the second ferroelectric memory cell is switchable into a first ferroelectric memory cell state and a second ferroelectric memory cell state; and
wherein the first matching state is defined by the first ferroelectric memory cell in the first ferroelectric memory cell state and the second ferroelectric memory cell in the second ferroelectric memory cell state, wherein the second matching state is defined by the first ferroelectric memory cell in the second ferroelectric memory cell state and the second ferroelectric memory cell in the first ferroelectric memory cell state, and wherein the third matching state is defined by the first ferroelectric memory cell and the second ferroelectric memory cell being in the same ferroelectric memory cell state.

18. The ternary memory cell arrangement of claim 17,
wherein, in the case of a parallel arrangement, each ferroelectric memory cell of a corresponding first subset is configured to,
in the first ferroelectric memory cell state, electrically conductively connect a first match line to a second match line in the case that a second lookup voltage is applied to a corresponding control terminal of the ferroelectric memory cell and electrically isolate the first match line from the second match line in the case that a first lookup voltage is applied to the corresponding control terminal, and,
in the second ferroelectric memory cell state, electrically isolate the first match line from the second match line for both cases either if the first lookup voltage or the second lookup voltage is applied to the corresponding control terminal.

19. The ternary memory cell arrangement of claim 17,
wherein, in the case of the serial arrangement, each ferroelectric memory cell of the corresponding first subset is configured to,
in the second ferroelectric memory cell state, electrically conductively connect a first match line to a second match line in the case that a second lookup voltage is applied to a corresponding control terminal of the ferroelectric memory cell and electrically isolate the first match line from the second match line in the case that a first lookup voltage is applied to the corresponding control terminal, and,
in the first ferroelectric memory cell state, electrically conductively connect the first match line to the second match line for both cases either if the first lookup voltage or the second lookup voltage is applied to the corresponding control terminal.

20. The ternary memory cell arrangement of claim 17, further comprising:
one or more programming circuits coupled to the plurality of match line drivers and the plurality of lookup line drivers and configured to program each of the plurality of ternary memory cells and to thereby store the corresponding stored word in each of the plurality of first subsets.

* * * * *